United States Patent [19]
Saito

[11] Patent Number: 6,094,373
[45] Date of Patent: Jul. 25, 2000

[54] NONVOLATILE SEMICONDUCTOR MEMORY DEVICE

[75] Inventor: Hidetoshi Saito, Yokohama, Japan

[73] Assignee: Kabushiki Kaisha Toshiba, Tokyo, Japan

[21] Appl. No.: 09/031,240

[22] Filed: Feb. 26, 1998

[30] Foreign Application Priority Data

Feb. 27, 1997 [JP] Japan .................................. 9-043823

[51] Int. Cl.$^7$ .................................................. G11C 16/06
[52] U.S. Cl. .............................. 365/185.22; 365/185.29; 365/185.11; 365/201
[58] Field of Search ...................... 365/185.22, 185.29, 365/201, 236, 185.11

[56] References Cited

U.S. PATENT DOCUMENTS 5,805,510  8/1998  Miyakawa et al. ............ 365/185.22 X
5,844,843  12/1998  Matsubara et al. ............ 365/185.29 X

*Primary Examiner*—Huan Hoang
*Attorney, Agent, or Firm*—Loeb & Loeb LLP

[57] ABSTRACT

This invention is made to reduce the circuit area and shorten the testing time by simplifying the construction of the control circuit and reducing the number of commands. In the automatic programming operation, PVOK is set to "0", EVOK and LCKOK are set to "1", and a memory cell is selected by an address latched in the address register. That is, the subroutine of a pre-program operation is effected with the address fixed. None of the subroutines of an erase operation and convergence operation are effected. In the erase operation, PVOK, EVOK and LCKOK are all set to "0" and memory cells are sequentially selected by the internal address of the address counter. That is, each of the memory cells selected by the internal address is subjected to the pre-program, erase and convergence operations.

17 Claims, 15 Drawing Sheets

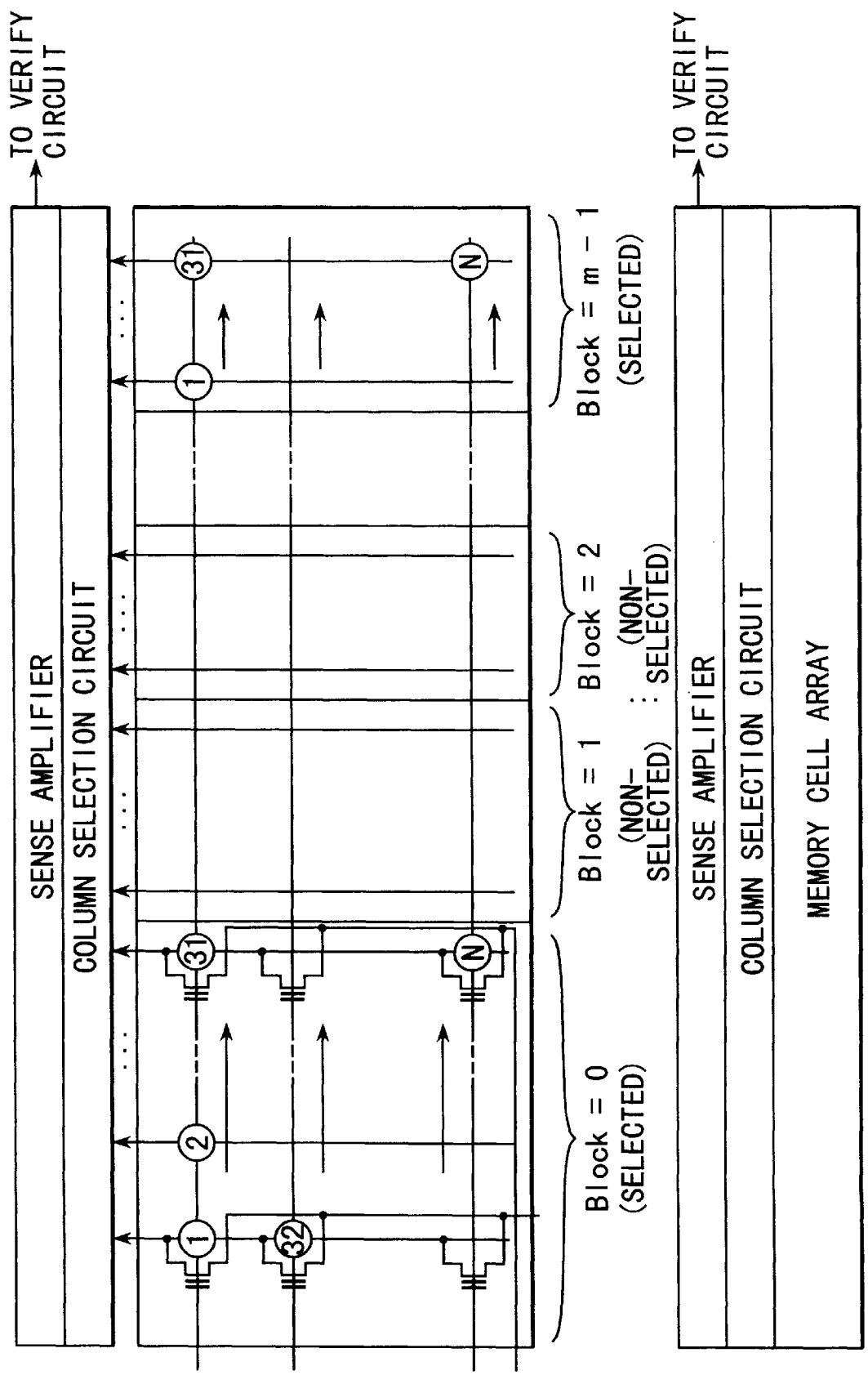
F I G. 16

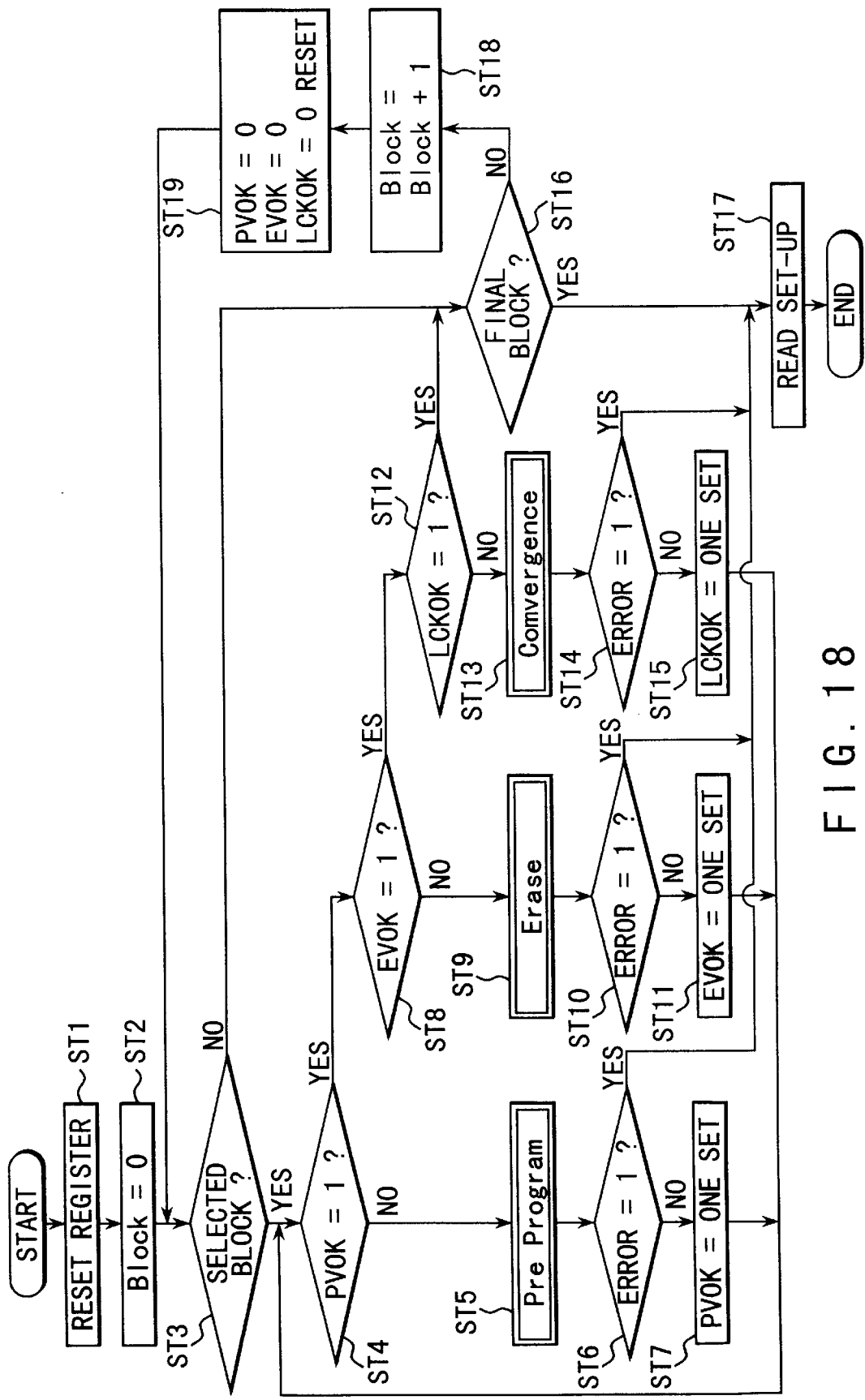
F I G. 18

NONVOLATILE SEMICONDUCTOR MEMORY DEVICE

BACKGROUND OF THE INVENTION

This invention relates to a nonvolatile semiconductor memory device such as a NOR type flash EEPROM having an automatic programming function and automatic erasing function.

A flash EEPROM capable of electrically reprogramming data has three modes of programming, erasing and reading as basic modes. The program mode is an operation for raising the threshold voltage of a memory cell to a preset value (for example, 5.5 V) or more, and the erase mode is an operation for lowering the threshold voltage of a memory cell to a preset value (for example, in a range of 0.5 to 3.0 V).

Further, in the nonvolatile semiconductor memory device having the automatic programming function and automatic erasing function, whether or not the threshold voltage of the memory cell becomes equal to or higher than 5.5 V is verified, for example, and the data reprogramming operation is automatically effected until the threshold voltage of the memory cell becomes equal to or higher than 5.5 V in the program mode, and whether or not the threshold voltage of the memory cell is set in a range of 0.5 to 3.0 V is verified, for example, and a preset operation is automatically effected until the threshold voltage of the memory cell is set into a range of 0.5 to 3.0 V in the erase mode.

A verify circuit 23 verifies whether or not the operation of programming data into or erasing data in a selected memory cell is sufficiently effected and outputs the verification result VERLOK to the control circuit 21.

A final address detecting circuit 24 outputs a detection signal AEND indicating that the final address of each block of the memory cell array 11 is detected or not and a detection signal BEND indicating that the final block of the memory cell array 11 is detected or not.

A timer 25 counts the number of operations of data programming or erasing effected with respect to a selected memory cell. The timer 25 outputs a time-out signal TIME OUT to the control circuit 21 when the number of operations of data programming or erasing effected with respect to a selected memory cell has reached a preset number.

A clock generating circuit 26 generates a clock for controlling the internal operation of the flash EEPROM according to signals such as a write enable signal /WE, chip enable signal /CE, and output enable signal /OE.

Next, various operations such as the automatic programming operation and automatic erasing operation in the flash EEPROM are explained with reference to the following Table 1.

TABLE 1

| MODE | CYCLE | 1st | 2nd | 3rd | 4th | 5th | 6th | | nth |
|---|---|---|---|---|---|---|---|---|---|
| PROGRAM | ADDRESS | 5555 | 2AAA | 5555 | P.A. | | | | |
| | DATA | AA | 55 | A0 | P.D. | | | | |
| BLOCK | ADDRESS | 5555 | 2AAA | 5555 | 5555 | 2AAA | B.A. | ... | B.A. |
| ERASING | DATA | AA | 55 | 80 | AA | 55 | 30 | | 30 |
| CHIP | ADDRESS | 5555 | 2AAA | 5555 | 5555 | 2AAA | 5555 | | |
| ERASING | DATA | AA | 55 | 80 | AA | 55 | 10 | | |

P.A.: Program Address
P.D.: Program Data
B.A.: BLOCK Erasing Address

FIG. 1 shows a main portion of a conventional nonvolatile semiconductor memory device having the automatic programming function and automatic erasing function.

A memory cell array 11 includes a plurality of blocks each of which includes NOR type memory cells.

External addresses A0, A1 to A17 are input to a multiplexer 13 directly or via an address register 12. An address counter 16 generates an internal address. The multiplexer 13 supplies one of the external address and internal address to a row decoder 14 and column decoder 15.

Input data is supplied to a data input register 18 and command register 19 via an input/output buffer 17. Data in the data input register 18 is supplied to a memory cell via a column selection circuit 20.

The command register 19 recognizes a command constructed by an address and data and outputs control signals to the address register 12, multiplexer 13, data input register 18 and control circuit 21 according to the command.

The control circuit 21 recognizes the operation mode to be next effected based on the control signal output from the command register 19.

A voltage generating circuit 22 generates various voltages corresponding to the operation modes. A voltage generated from the voltage generating circuit 22 is supplied to the bit lines and the control gates of the memory cells in each operation mode.

(1) First, the Automatic Programming Operation is Explained.

A command for the automatic program mode is constructed by addresses and data fetched into the chip in four successive cycles as shown in Table 1 and FIG. 2.

That is, the command register 19 recognizes the program command in the first to third cycles in an initial period and outputs a control signal to the address register 12 and data input register 18 in the fourth cycle so as to permit the program address P.A. and program data P.D. to be respectively latched in the address register 12 and data input register 18.

Further, when the command register 19 recognizes the program command, it outputs a control signal indicating that the program command is recognized to the control circuit 21 and outputs a control signal to the multiplexer 13 so as to permit the address in the address register 12 to be supplied to the row decoder 14 and column decoder 15.

When receiving the control data, the control circuit 21 controls the operations of the respective circuits to execute the automatic program sequence as shown in FIG. 3.

First, the address counter 16, timer 25 and the like are reset and the internal power supply of the program verify P.V. is set up in the voltage generating circuit 22 (steps ST1 to ST3).

After this, data of a memory cell or memory cells (n memory cells (n is a positive natural number) when the flash EEPROM is of xn type) selected by the program address P.A. is read out (step ST4).

Data of a memory cell (which is hereinafter referred to as a selected memory cell) selected by the program address P.A. is compared with the program data P.D. (step ST5).

That is, the lower limit voltage (for example, 5.5 V) of the threshold voltage which is determined as the programmed state is set as a boundary value, data of the selected memory cell is determined as "0" if the threshold value of the selected memory cell is higher than the boundary value, and data of the selected memory cell is determined as "1" if the threshold value of the selected memory cell is lower than the boundary value.

Then, data of the selected memory cell is compared with the program data P.D. that is, data "0", and if the compared data items coincide with each other, it is determined that the sufficient or effective programmed state is attained, a read set-up process for discharging a boosted voltage generated from a charge pump circuit is effected and then the automatic programming operation is terminated (step ST6).

If data of the selected memory cell does not coincide with the program data P.D., it is determined that the programmed state is insufficient or ineffective and the data programming operation is effected for the selected memory cell (electrons are injected into the floating gate).

The data programming operation is repeatedly effected until data of the selected memory cell becomes equal to the program data P.D. if a preset number Limit is not reached (steps ST7 to ST9).

When the number Cycle of program operations for the selected memory cell has reached the preset number Limit, the automatic programming operation is terminated (steps ST6, ST7) after the read set-up process is effected even if data of the selected memory cell does not coincide with the program data P.D.

In this case, a signal ERROR indicating occurrence of a defective programmed state is set to "1" (step ST10).

(2) Next, the Automatic Erasing Operation is Explained.

The command register 19 recognizes the erase command in the first to fifth cycles in an initial period and recognizes a block of the memory cell array 11 which is subjected to the erase operation based on commands in the sixth and succeeding cycles.

That is, if no command is input in a preset period of time after a command indicating an address of a block to be subjected to the erase operation is input in the sixth or succeeding cycle and a command indicating an address of a pres et block to be subjected to the erase operation is input in the nth cycle, the control circuit 21 controls the operations of the circuits to execute the automatic erase sequence shown in FIG. 4.

Further, the command register 19 outputs a control signal to the multiplexer 13 so as to permit the internal address of the address counter 16 to be supplied to the row decoder 14 and column decoder 15.

As shown in FIG. 4, the automatic erasing operation is constructed by the following three stages.

1. Pre Program
2. Erase
3. Convergence

The pre-program operation is an operation for making equal the threshold values of all of the memory cells in each selected block before erasing. The erase operation is an operation for simultaneously erasing data items of all of the memory cells for each selected block. The convergence operation is an operation for detecting a memory cell or cells in the excessively erased state in each selected block and restoring the threshold value of the memory cell in the excessively erased state to a normal value for each bit line.

The above operations are explained in detail below with reference to FIG. 4.

In the following explanation, a case wherein selection or non-selection is sequentially recognized for each block in all of the blocks of the memory cell array is taken as an example.

First, the address counter 16, timer 25 and the like are reset and the address block BLOCK is set to an initial value "0" (steps ST1, ST2).

Next, whether or not a block selected by the block address BLOCK is a selected block to be subjected to the automatic erasing operation is verified (step ST3).

When the block selected by the block address BLOCK is a non-selected block (which is not subjected to the automatic erasing operation), whether or not a block selected by a next block address BLOCK is a selected block is verified (step ST11).

When the block selected by the block address BLOCK is a selected block, the pre-program operation is effected (step ST4).

The pre-program operation is effected according to the procedure shown by the subroutine of FIG. 5.

First, an address Add of the address counter 16 is set to an initial value "0" and a numeric value (corresponding to the number of program operations) Cycle of the timer 25 is set to an initial value "0" (steps ST41, ST42). Further, in the voltage generating circuit 22, the internal power supply of the program verify P.V. is set up (step ST43).

After this, data of a memory cell or memory cells (n memory cells (n is a positive natural number) when the flash EEPROM is of xn type) selected by the address Add is read out (step ST44).

Data of a memory cell (which is hereinafter referred to as a selected memory cell) selected by the address Add is compared with the program data "0" (step ST45).

That is, the lower limit voltage (for example, 5.5 V) of the threshold voltage which can be verified as the programmed state is set as a boundary value, data of the selected memory cell is determined as "0" if the threshold value of the selected memory cell is higher than the boundary value, and data of the selected memory cell is determined as "1" if the threshold value of the selected memory cell is lower than the boundary value.

Then, if data of the selected memory cell does not coincide with the program data "0", it is determined that the programmed state is insufficient and the data programming operation is effected for the selected memory cell (electrons are injected into the floating gate).

The data programming operation is repeatedly effected until data of the selected memory cell becomes equal to the program data "0" if a preset number Limit is not reached (steps ST48, ST49).

When the number Cycle of programming operations for the selected memory cell has reached the preset number Limit, the pre-program operation is terminated (step ST46) even if data of the selected memory cell does not coincide with the program data.

In this case, a signal ERROR indicating occurrence of a defective programmed state is set to "1" (step ST47).

If data of the selected memory cell coincides with the program data "0", it is determined that the programmed state is sufficient and the address Add is incremented by one, and the same operation is effected for a memory cell selected by a next address. At this time, the value of the timer 25 is reset to the initial value (steps ST42, ST51).

Further, when data of the selected memory cell coincides with the program data "0" and if the address Add is the final address in the block, the pre-program operation is terminated. At this time, the distribution of the threshold values of the memory cells in the selected block is obtained as shown in FIG. 6 (step ST50).

Next, whether the signal ERROR indicating the presence or absence of the defective programmed state is "1" or not is determined, and if the defective programmed state has occurred, that is, if the signal ERROR is "1", a read set-up process for discharging a boosted voltage generated from the charge pump circuit is effected and then the automatic erasing operation is terminated (steps ST5, ST12).

If the pre-program operation is correctly effected, that is, if the signal ERROR is "0", the erase operation is effected (step ST6).

The erase operation is effected according to the procedure shown by the subroutine of FIG. 7.

First, the address Add of the address counter 16 is set to the initial value "0" and the value (corresponding to the number of erasing operations) Cycle of the timer 25 is set to the initial value "0" (steps ST61, ST62). Further, the internal power supply of the erase verify E.V. is set up in the voltage generating circuit 22 (step ST63).

After this, data of a memory cell or memory cells (n memory cells (n is a positive natural number) when the flash EEPROM is of xn type) selected by the address Add is read out (step ST64).

Data of a memory cell (which is hereinafter referred to as a selected memory cell) selected by the address Add is compared with the expected value "1" (step ST65).

That is, the upper limit voltage (for example, 3.0 V) of the threshold voltage which can be verified as the erased state is set as a boundary value, data of the selected memory cell is determined as "0" if the threshold value of the selected memory cell is higher than the boundary value, and data of the selected memory cell is determined as "1" if the threshold value of the selected memory cell is lower than the boundary value.

If data of the selected memory cell does not coincide with the expected value "1", it is determined that the erased state is insufficient and the data erasing operation is effected for all of the memory cells in the selected block (electrons in the floating gates are drawn out).

In this case, the data erasing operation (flash erasing) is effected for all of the memory cells in the selected block and the data erasing operation is a peculiar operation of the flash EEPROM. Therefore, the data erasing operation is effected not only for the selected memory cell but also for the memory cells in which data is already erased.

The erasing operation is repeatedly effected (steps ST66, ST68, ST69) until data of the selected memory cell becomes equal to the expected value "1" if a preset number Limit is not reached.

When the number Cycle of erasing operations for the selected memory cell has reached the preset number Limit, the erase operation is terminated (step ST66) even if data of the selected memory cell does not coincide with the expected value "1".

In this case, a signal ERROR indicating occurrence of a defective erased state is set to "1" (step ST67).

On the other hand, if data of the selected memory cell coincides with the expected value "1", it is determined that the erased state of the selected memory cell is sufficient, and then the address Add is incremented by one and the same operation is effected for a memory cell selected by a next address. At this time, the value of the timer 25 is not reset to the initial value. This is because the erase operation is effected for all of the memory cells (step ST71).

Further, when data of the selected memory cell coincides with the expected value "1" and if the address Add is the final address in the block, the erase operation is terminated. At this time, the distribution of the threshold values of the memory cells in the selected block is obtained as shown in FIG. 8 (step ST70).

Next, whether the signal ERROR indicating the presence or absence of the defective erased state is "1" or not is determined, and if the defective erased state has occurred, that is, if the signal ERROR is "1", a read set-up process for discharging a boosted voltage generated from the charge pump circuit is effected and then the automatic erasing operation is terminated (steps ST7, ST12).

If the erase operation is correctly effected, that is, if the signal ERROR is "0", the convergence operation is effected (step ST8).

The convergence operation is effected according to the procedure shown by the subroutine of FIG. 9.

First, the address (which is used for selecting only a column and none of the rows are selected) Add of the address counter 16 is set to an initial value and the value (corresponding to the number of convergence operations) Cycle of the timer 25 is set to the initial value "0" (steps ST81, ST82). Further, the internal power supply for the leak check LCK. is set up in the voltage generating circuit 22 (step ST83).

After this, the column leak checking process (leak checking of a memory cell for each column) is effected (step ST84).

The column leak checking process is to set all of the rows (word lines) into the non-selected state, set one column into the selected state and check the leak current flowing in the selected column so as to verify whether or not a memory cell in the excessively erased state is present.

That is, if the total sum of the leak currents flowing in all of the memory cells on the selected column is smaller than a reference value, data of the selected column is determined as "0", and if the total sum of the leak currents flowing in all of the memory cells on the selected column is larger than the reference value, data of the selected column is determined as "1".

The leak current occurs in a memory cell which is set in the excessively erased state and whose threshold voltage is lower than 0.5 V. That is, the memory cell set in the excessively erased state permits current flow even if it is not selected (the word line is set at 0 V).

Then, data of the selected column is compared with the expected value "0" (step ST85).

If data of the selected column does not coincide with the expected value "0", it is determined that the convergence state is insufficient and the convergence operation (for eliminating the excessively erased state) is simultaneously effected for all of the memory cells on the selected column.

The convergence operation is repeatedly effected until data of the selected memory cell becomes equal to the expected value "0" if a preset number Limit is not reached (steps ST86, ST88, ST89).

When the number Cycle of convergence operations for the selected column has reached the preset number Limit, the convergence operation is terminated (step ST86) even if data of the selected memory cell does not coincide with the expected value "0".

In this case, a signal ERROR indicating that the convergence operation is not completely effected is set to "1" (step ST87).

On the other hand, if data of the selected column coincides with the expected value "0", it is determined that the sufficient convergence state is attained for all of the memory cell on the selected column and the address Add is incremented by one, and the same operation is effected for memory cells on a next column (step ST91).

Further, when data of the selected column coincides with the expected value "0" and if the address Add is an address for selecting the final column in the block, the convergence operation is terminated.

When the convergence operation for all of the columns is terminated, the distribution of the threshold values of the memory cells in the selected block is obtained as shown in FIG. 10 (step ST90).

Next, whether or not the signal ERROR indicating that the convergence operation is not completely effected is set at "1" is determined, and if the signal ERROR is "1", the read set-up process for discharging the boosted voltage generated from the charge pump circuit is effected and then the automatic erasing operation is terminated (steps ST9, ST12).

If the signal ERROR is "0", whether the selected block is a final block or not is determined and if it is determined that the selected block is the final block, the automatic erasing operation is terminated after the read set-up process is effected, and if the selected block is not the final lock, the above-described operation is effected for a next block (steps ST10 to ST12).

The above explanation is made for a case of block erasing, but the above-described automatic erase sequence can be used as it is for a case of chip erasing, and at this time, it is only necessary to set all of the blocks in the selected state in the above-described automatic erase sequence.

(3) Next, the Other Operation is Explained.

In the flash EEPROM, various types of test operations are provided in addition to the above-described automatic programming operation and automatic erasing operation.

FIG. 11 shows the sequence of the program test operation and the subroutine of FIG. 5 is used for the "Pre-Program" operation in the step ST4. FIG. 12 shows the sequence of the erase test operation and the subroutine of FIG. 7 is used for the "Erase" operation in the step ST4. FIG. 13 shows the sequence of the convergence test operation and the subroutine of FIG. 9 is used for the "Convergence" operation in the step ST4.

Conventionally, in the flash EEPROM described above, one of the automatic programming operation, automatic erasing operation and test operations to be next effected is determined by supplying one of inherent commands which respectively correspond to the above operations to the memory chip from the exterior of the memory chip and identifying the command as shown in Table 1.

Further, in order to determine the operation to be next effected based on the command inherent to the corresponding operation, the sequences of the automatic programming operation, automatic erasing operation and test operations are independently set as shown in FIGS. 3, 4, 11 to 13.

Therefore, a circuit for inputting and identifying the command for determining the operation of the flash EEPROM becomes complicated and large in size and the control operation in the control circuit for controlling the operations of various circuit sections becomes complicated.

BRIEF SUMMARY OF THE INVENTION

This invention has been made to solve the above problems and an object of this invention is to simplify the circuit for identifying the command and alleviating the load of the control circuit by realizing the automatic programming operation, automatic erasing operation and test operations by use of one sequence and thus reducing the number of commands used.

In order to attain the above object, a nonvolatile semiconductor memory device of this invention comprises a verify bit register having a first bit for determining whether a program operation is effected or not, a second bit for determining whether an erase operation is effected or not and a third bit for determining whether a convergence operation is effected or not, for determining values of the first to third bits according to operation modes; and a control circuit for effecting at least one of the program, erase and convergence operations according to the values of the first to third bits.

The control circuit determines whether the program operation is effected or not based on the value of the first bit when the program or erase operation is effected for a memory cell, determines whether the erase operation is effected or not based on the value of the second bit when it is determined that the program operation is not effected, determines whether the convergence operation is effected or not based on the value of the third bit when it is determined that the erase operation is not effected, and terminates the program or erase operation when it is determined that the convergence operation is not effected.

The nonvolatile semiconductor memory device of this invention further comprises a command register for recognizing the operation mode.

The control circuit outputs a fourth bit indicating a state in which the program operation is effected, a fifth bit indicating a state in which the erase operation is effected and a sixth bit indicating a state in which the convergence operation is effected to the verify bit register.

The nonvolatile semiconductor memory device of this invention further comprises an address counter for generating an internal address, and a timer for detecting the number of verify operations. The control circuit resets the value of the address counter and the value of the timer when the command register recognizes the operation mode.

The nonvolatile semiconductor memory device of this invention further comprises a verify circuit for effecting the verify operation. The verify circuit outputs a seventh bit indicating the result of the verify operation to the verify bit register.

The nonvolatile semiconductor memory device of this invention further comprises a final address detecting circuit for outputting an eighth bit indicating that the internal address is a final address.

The nonvolatile semiconductor memory device of this invention further comprises a row and column decoder, an address register for latching an external address, and a multiplexer for selecting one of the internal address, external address and the address latched in the address register and supplying the selected address to the row and column decoder.

When the command register recognizes the command of the automatic program mode, the second and third bits are set to values which inhibit the erase and convergence operations and the first bit is set to a value which permits or inhibits the program operation according to the value of the seventh bit.

When the command register recognizes the command of the automatic program mode, the multiplexer supplies the address latched in the address register to the row and column decoder.

When the command register recognizes the command of the automatic program mode, the eighth bit is forcedly set to a value indicating the state in which the final address is detected.

When the command register recognizes the command of the automatic erase mode, the first, second and third bits are respectively set to preset values according to the values of the fourth, fifth, sixth and seventh bits.

When the command register recognizes the command of the automatic erase mode, the multiplexer supplies the internal address of the address counter to the row and column decoder.

In a case where the memory cell array is constructed by a plurality of blocks and the automatic erasing operation is effected for each of the blocks, the final address detecting circuit outputs a ninth bit indicating that a block which is subjected to the automatic erasing operation is a final block or not.

The verify bit register is supplied with a reset signal and the values of the first to third bits can be reset to preset values according to the reset signal.

When the number of verify operations has reached a preset number set in the timer, the control circuit does not effect the programming, erasing or convergence operation again.

The nonvolatile semiconductor memory device of this invention further comprises a test circuit for outputting a first test bit for forcedly setting the first bit to the value which permits the program operation, a second test bit for forcedly setting the second bit to the value which permits the erase operation and a third test bit for forcedly setting the third bit to the value which permits the convergence operation to the verify bit register.

When the command register recognizes the command of the automatic erase mode, at least one of the program, erase and convergence operations is tested according to the values of the first to third test bits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a diagram showing the state in which the erase and pre-program operations (including the test operations) are effected for each bit;

FIG. 18 is a diagram showing an auto-sequence associated with this invention.

DETAILED DESCRIPTION OF THE INVENTION

There will now be described a nonvolatile semiconductor memory device of this invention in detail with reference to the accompanying drawings.

Figure 14:
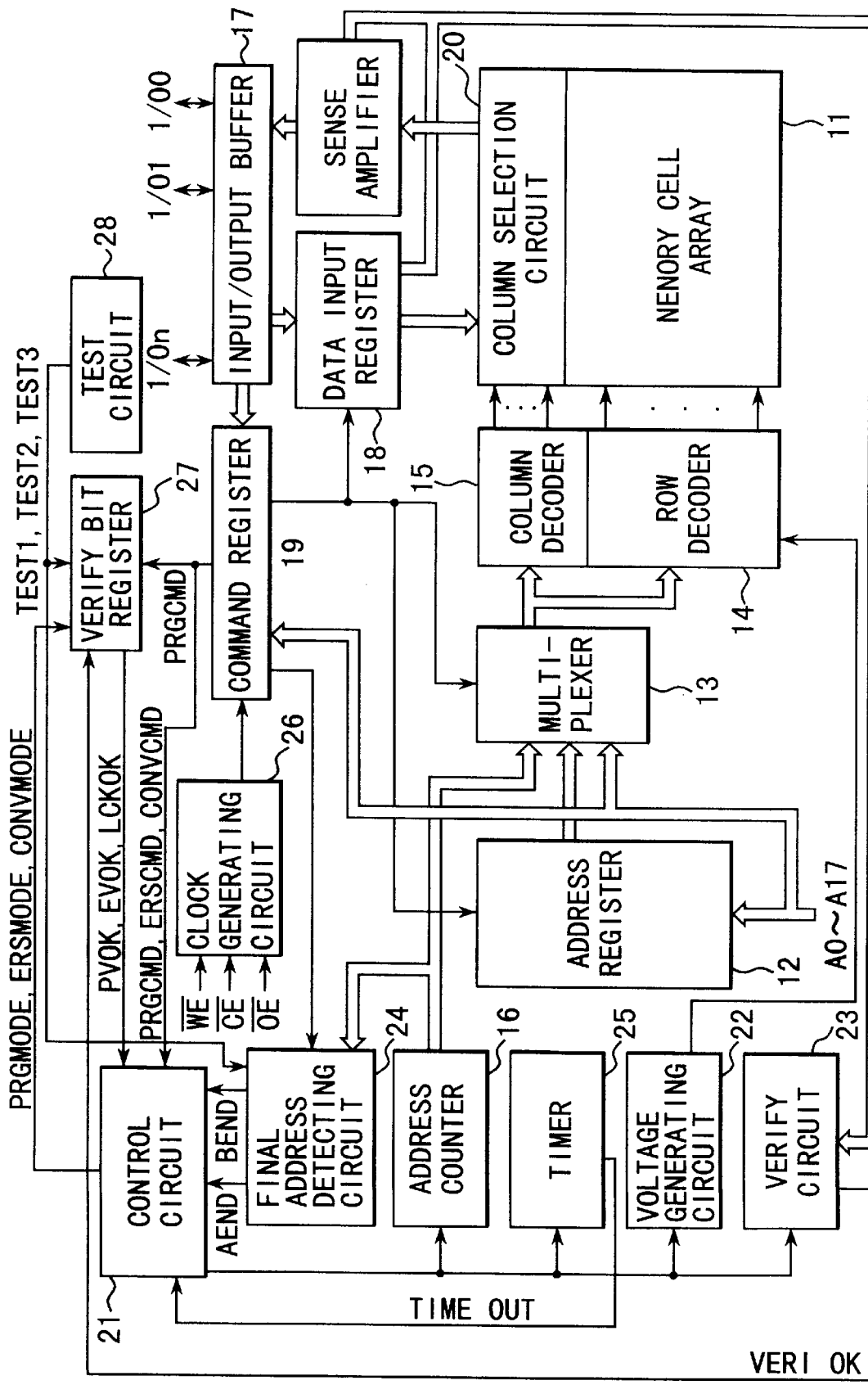
FIG. 14 is a block diagram showing a nonvolatile semiconductor memory device of this invention.

FIG. 14 shows the main portion of a flash EEPROM of this invention having the automatic programming function and automatic erasing function.

For example, a memory cell array 11 is of xn type in which n-bit data (n is a positive natural number) can be simultaneously input or output, and in this case, the memory cell array 11 is constructed by n blocks. Each block is further divided into m blocks which can be treated as one unit to be simultaneously subjected to the erase operation. The memory cell array 11 is constructed by NOR type memory cells, for example.

External addresses A0, A1 to A17 are input to a multiplexer 13 directly or via an address register 12. An address counter 16 generates an internal address. The multiplexer 13 supplies one of the external address and internal address to a row decoder 14 and column decoder 15.

Input data is supplied to a data input register 18 and command register 19 via an input/output buffer 17. Data in the data input register 18 is supplied to a memory cell via a column selection circuit 20.

The command register 19 recognizes a command constructed by an address and data and outputs control signals to the address register 12, multiplexer 13, data input register 18 and verify bit register 27 according to the command.

Further, when the command register 19 recognizes a command of the automatic program mode, it sets a signal (bit) PRGCMD indicating that the automatic program mode is recognized to "1".

The signals PRGCMD, ERSCMD, CONVCMD are supplied to the control circuit 21 and the signal PRGCMD is supplied to the verify bit register 27.

The verify bit register 27 generates three new bits of PVOK, EVOK and LCKOK based on the signal PRGCMD from the command register 19, signals TEST1 to TEST3 from the test circuit 28 and a signal VERIOK from the verify circuit 23 and outputs the bits to the control circuit 21.

The bit PVOK indicates that the program operation (including the pre-program operation) is terminated in the sufficient programmed state or not and PVOK of "1" indicates that the program operation is terminated in the sufficient programmed state. The bit EVOK indicates that the erase operation is terminated in the sufficient erased state or not and EVOK of "1" indicates that the program operation is terminated in the sufficient erased state. The bit LCKOK indicates that the convergence operation is terminated in the sufficient convergence state or not and LCKOK of "1" indicates that the convergence operation is terminated in the sufficient convergence state.

The three bits PVOK, EVOK, LCKOK are selectively set to "0" or "1" according to the signal VERIOK from the verify circuit 23. Further, the three bits PVOK, EVOK, LCKOK can be independently and forcedly set to "1" by the test signals TEST1 to TEST3.

The control circuit 21 recognizes an operation mode to be next effected based on the three bits PVOK, EVOK, LCKOK output from the verify bit register 27.

Further, the control circuit 21 outputs signals PRGMODE, ERSMODE, CONVMODE indicating the operation mode now effected to the verify bit register 27. For example, when the automatic program mode or the pre-program operation of the erase mode is effected, the signal PRGMODE is set to "1" and the other signals ERSMODE, CONVMODE are set to "0".

Likewise, when the erase operation of the automatic erase mode is effected, the signal ERSMODE is set to "1" and the other signals PRGMODE, CONVMODE are set to "0". Further, when the convergence operation of the automatic erase mode is effected, the signal CONVMODE is set to "1" and the other signals PRGMODE, ERSMODE are set to "0".

The voltage generating circuit 22 generate various voltages corresponding to the operation modes. The voltage generated from the voltage generating circuit 22 is applied to the control gate of the memory cell and the bit line in each operation mode.

The verify circuit 23 verifies whether or not the operation of writing or erasing data with respect to a selected memory cell is correctly effected and outputs a signal VERIOK indicating the result of the verify operation to the control circuit 21 each time the verify operation is effected. The signal VERIOK is set to "1" when the sufficient programmed state or sufficient erased state is attained.

The final address detecting circuit 24 outputs a detection signal AEND indicating that the final address of each block of the memory cell array 11 is detected or not and outputs a signal BEND indicating that the final block of the memory cell array 11 is detected or not.

An output signal of the command register 19 is input to the final address detecting circuit 24 and the detection signals AEND, BEND are forcedly set to "1" when a specified command is effectively set. Further, the detection signals AEND, BEND can be forcedly set to "1" by the test signals TEST1 to TEST3.

The timer 25 counts the number of operations of programming or erasing data with respect to a selected memory cell. The timer 25 outputs a time-out signal TIME OUT to the control circuit 21 when the number of operations of programming or erasing data with respect to the selected memory cell has reached a preset number.

The clock generating circuit 26 generates a clock signal for controlling the internal operation of the flash EEPROM according to signals such as a write enable signal /WE, chip enable signal /CE and output enable signal /OE.

Figure 15:
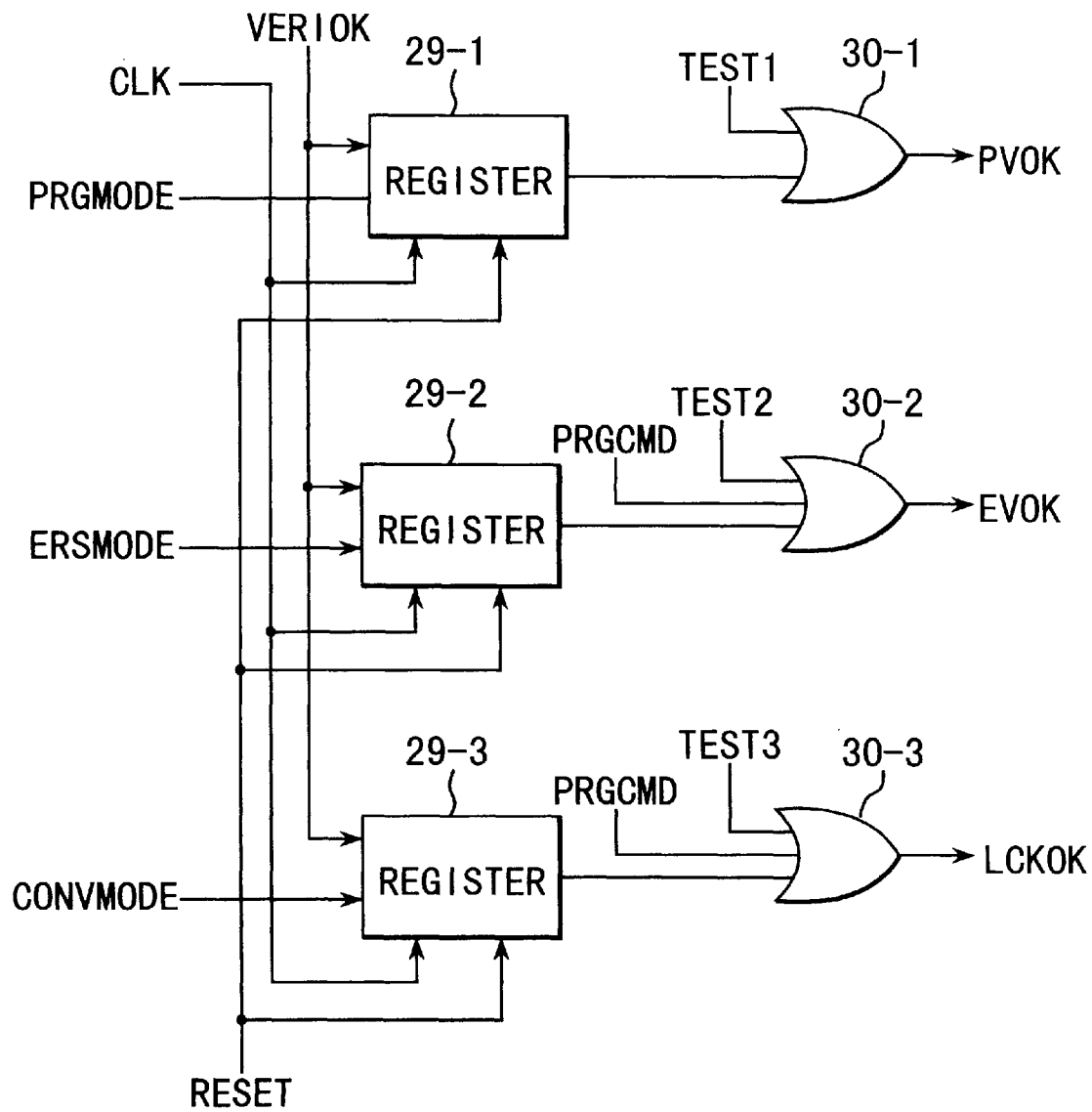
FIG. 15 is a diagram showing one example of the construction of a verify bit register shown in FIG. 14.

FIG. 15 shows one example of the construction of the verify bit register 27 shown in FIG. 14.

TABLE 2

| | PRGMODE | ERSMODE | CONVMODE | PRGCMD |
|---|---|---|---|---|
| PROGRAM | 1 | 0 | 0 | 1 |
| BLOCK ERASE | * | * | * | 0 |
| CHIP ERASE | * | * | * | 0 |
| TEST-PROGRAM | 1 | 0 | 0 | 0 |
| TEST-ERASE | 0 | 1 | 0 | 0 |
| TEST-CONVERGENCE | 0 | 0 | 1 | 0 |
| TEST-PROGRAM-ERASE | * | * | 0 | 0 |
| TEST-ERASE-CONVERGENCE | 0 | * | * | 0 |
| TEST-PROGRAM-CONVERGENCE | * | 0 | * | 0 |

*: "0" or "1"

The control signal PRGMODE of the control circuit 21 is input to a register 29-1, the control signal ERSMODE is input to a register 29-2, and the control signal CONVMODE is input to a register 29-3.

The operations of the registers 29-1 to 29-3 are controlled by the clock signal CLK. Data latched in the registers 29-1 to 29-3 can be initialized to "0" by a reset signal RESET.

As indicated in Table 2, the control signal PRGMODE is set at "1" while the program operation (including the pre-program operation) is effected, the control signal ERSMODE is set at "1" while the erase operation is effected, and the control signal CONVMODE is set at "1" while the convergence operation is effected.

Since the output signal VERIOK of the verify circuit 23 is set at "1" when a desired result of verify is attained, it is naturally set to "1" when the program operation (including the pre-program operation), erase operation or convergence operation for all of the memory cells in the block is correctly effected.

Further, while the program operation is effected, the control signal PRGMODE is set at "1" and the control signals ERSMODE, CONVMODE are set at "0". Therefore, data "0" is latched in the register 29-1 if the output signal VERIOK of the verify circuit 23 is set to "0" while the program operation is effected, and data "1" is latched in the register 29-1 if the output signal VERIOK of the verify circuit 23 is set to "1".

On the other hand, the control signal PRGMODE is set at "0" (one of the control signals ERSMODE and CONVMODE is set at "1" and the other control signal is set at "0" while the convergence operation or the erase operation other than the program operation is effected. Therefore, in this case, the register 29-1 continues to latch data "0" or "1" which is now latched therein irrespective of the value of the output signal VERIOK of the verify circuit 23.

An OR circuit 30-1 is supplied with an output signal of the register 29-1 and the test signal TEST1. An output signal (bit) PVOK of the OR circuit 30-1 is set to "1" when the output signal of the register 29-1 is "1" and it is forcedly set to "1" when the test signal TEST1 is set to "1".

An OR circuit 30-2 is supplied with an output signal of a register 29-2, test signal TEST2 and output signal PRGCMD of the command register 19. An output signal (bit) EVOK of the OR circuit 30-2 is set to "1" when the output signal of the register 29-2 is "1" and it is forcedly set to "1" when the signal PRGCMD or test signal TEST2 is set to "1".

An OR circuit 30-3 is supplied with an output signal of a register 29-3, test signal TEST3 and output signal PRGCMD of the command register 19. An output signal (bit) LCKOK of the OR circuit 30-3 is set to "1" when the output signal of the register 29-3 is "1" and it is forcedly set to "1" when the signal PRGCMD or test signal TEST3 is set to "1".

Table 3 indicates the relation between the control signals PRGMODE, ERSMODE, CONVMODE, control signal VERIOK, control signals PVOK, EVOK, LCKOK.

TABLE 3

| PRGMODE | ERSMODE | CONVMODE | VERIOK | PVOK | EVOK | LCKOK |
|---------|---------|----------|--------|------|------|-------|
| 1 | 0 | 0 | 0 | 0 | * | * |
|   |   |   | 1 | 1 | * | * |
| 0 | 1 | 0 | 0 | * | 0 | * |
|   |   |   | 1 | * | 1 | * |
| 0 | 0 | 1 | 0 | * | * | 0 |
|   |   |   | 1 | * | * | 1 |

*: "0" or "1" (the previous state is kept unchanged)

Further, Table 4 indicates the relation between the various modes and the test signals TEST1 to TEST3, and Table 5 indicates the relation between the various modes and the control signals PVOK, EVOK, LCKOK, AEND, BEND.

TABLE 4

|  | TEST1 | TEST2 | TEST3 |
|---|---|---|---|
| PROGRAM | 0 | 0 | 0 |
| BLOCK ERASE | 0 | 0 | 0 |
| CHIP ERASE | 0 | 0 | 0 |
| TEST-PROGRAM | 0 | 1 | 1 |
| TEST-ERASE | 1 | 0 | 1 |
| TEST-CONVERGENCE | 1 | 1 | 0 |
| TEST-PROGRAM-ERASE | 0 | 0 | 1 |
| TEST-ERASE-CONVERGENCE | 1 | 0 | 0 |
| TEST-PROGRAM-CONVERGENCE | 0 | 1 | 0 |

TABLE 5

|  | PVOK | EVOK | LCKOK | AEND | BEND |
|---|---|---|---|---|---|
| PROGRAM | * | 1 | 1 | 1 | 1 |
| BLOCK ERASE | * | * | * | * | * |
| CHIP ERASE | * | * | * | * | * |
| TEST-PROGRAM | * | 1 | 1 | * | * |
| TEST-ERASE | 1 | * | 1 | * | * |
| TEST-CONVERGENCE | 1 | 1 | * | * | * |
| TEST-PROGRAM-ERASE | * | * | 1 | * | * |
| TEST-ERASE-CONVERGENCE | 1 | * | * | * | * |
| TEST-PROGRAM-CONVERGENCE | * | 1 | * | * | * |

*: "0" or "1"

Figure 17:
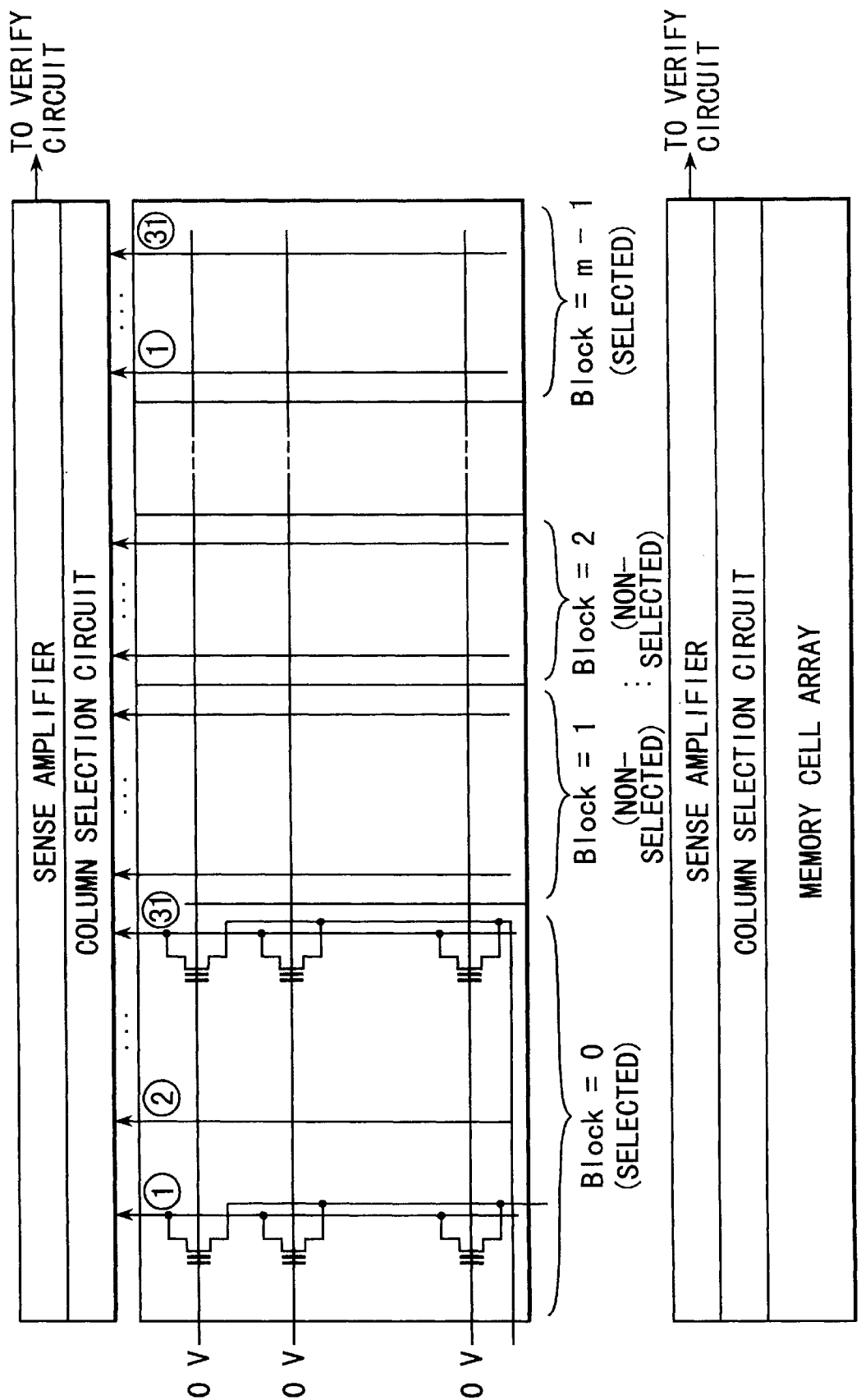
FIG. 17 is a diagram showing the state in which the convergence operation (including the test operation) is effected for each column.

FIGS. 16 and 17 show examples of the construction of the memory cell array 11 of FIG. 14.

The memory cell array 11 is of xn type which can simultaneously input or output n bits (n is a positive natural number). Therefore, the memory cell array 11 is constructed by n blocks. Each block is further divided into m blocks Block0 to Block(m−1) which are each treated as one unit to be simultaneously subjected to the erase operation. The memory cell array 11 is constructed by NOR type memory cells, for example.

The program operation and program verify operation are effected for the memory cells of a block i (i=0 to (m−1)) one at a time. Further, the erase operation is simultaneously effected for all of the memory cells of the block i (flash erasing), and the erase verify operation is effected for the memory cells of the block i one at a time. Further, the convergence operation and the convergence verify operation are effected for all of the memory cells for each column.

Next, various operations such as the automatic programming operation and automatic erasing operation in the above-described flash EEPROM are explained with reference to the auto-sequence shown in FIG. 18.

(1) First, the Automatic Programming Operation is Explained.

When the command register 19 recognizes a command of automatic program mode, it supplies a control signal to the address register 12 and data input register 18 so as to permit a program address and program data to be respectively latched in the address register 12 and data input register 18.

Further, when the command register 19 recognizes a command of automatic program mode, it supplies a control signal to the multiplexer 13 so as to permit the address of the address register 12 to be supplied to the row decoder 14 and column decoder 15. The control circuit 21 sets the control signal PRGMODE to "1" and sets the control signals ERSMODE, CONVMODE to "0".

At this time, since the control signal PRGCMD of the command register 19 is set at "1", the control signals EVOK, LCKOK are fixed at "1". Further, since the output of the register 29-1 is initialized to "0", the control signal PVOK is kept at "0". In this case, the test signals TEST1 to TEST3 are all set at "0".

The final address detecting circuit 24 fixes the output signals AEND, BEND thereof at "1" when the command register 19 recognizes a command of automatic program mode.

After this, the address counter 16, timer 25 and the like are reset. Further, since the control signal PVOK is "0", the automatic programming operation is started (steps ST1 to ST4).

Figure 5:
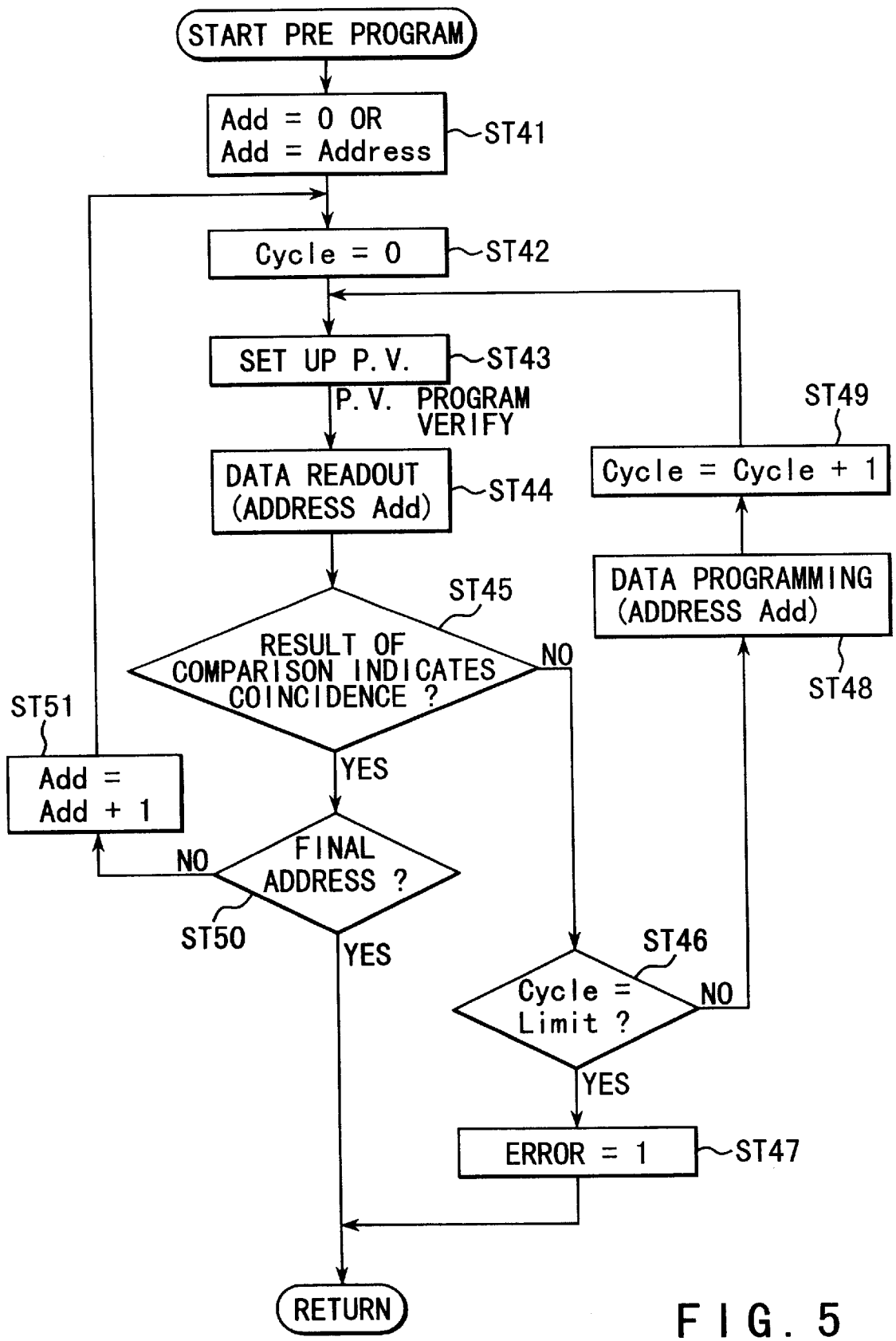
FIG. 5 is a diagram showing the subroutine of a pre-program operation.
Figure 6:
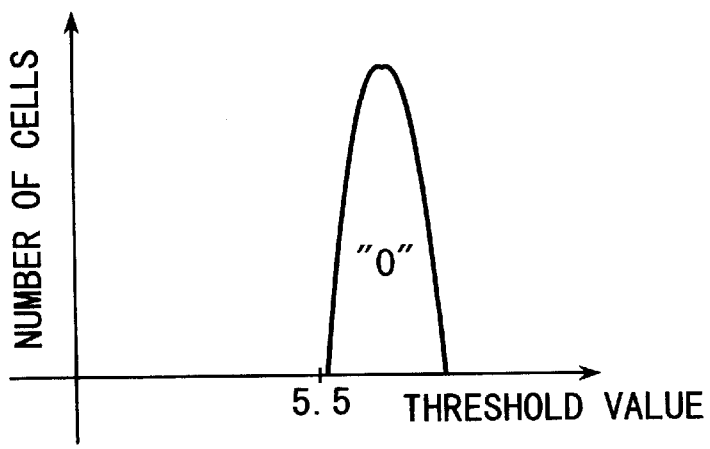
FIG. 6 is a diagram showing the distribution of threshold values obtained after the pre-program operation is effected for memory cells in a block.
Figure 8:
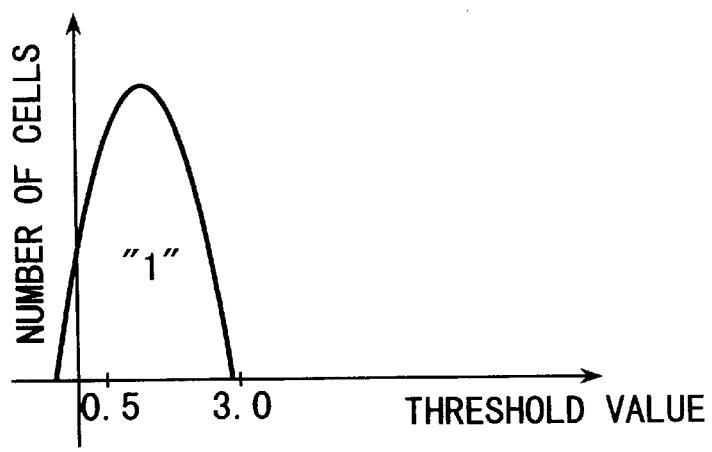
FIG. 8 is a diagram showing the distribution of threshold values obtained after the erase operation is effected for memory cells in a block.
Figure 10:
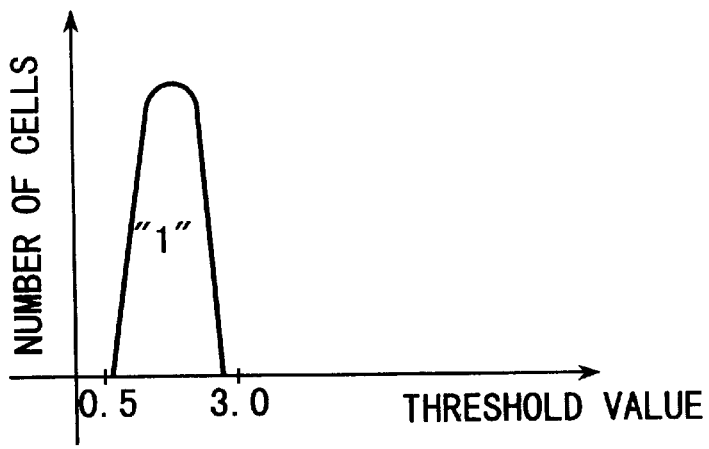
FIG. 10 is a diagram showing the distribution of threshold values obtained after the convergence operation is effected for memory cells in a block.

The automatic programming operation is effected according to the subroutine shown in FIG. 5.

First, the internal power supply of the program verify P.V. is set up in the voltage generating circuit 22. Then, data of a memory cell or cells (n memory cells when the flash EEPROM is of xn type) selected by the program address latched in the address register 12 is read out (steps ST41 to ST44).

Data of a memory cell (which is hereinafter referred to as a selected memory cell) selected by the program address latched in the address register 12 is compared with program data (step ST45).

That is, the lower limit voltage (for example, 5.5 V) of the threshold voltage which can be verified as the programmed state is set as a boundary value, data of the selected memory cell is determined as "0" if the threshold value of the selected memory cell is higher than the boundary value, and data of the selected memory cell is determined as "1" if the threshold value of the selected memory cell is lower than the boundary value.

Then, data of the selected memory cell is compared with the program data "0", and if the compared data items coincide with each other, it is determined that the programmed state is sufficient or effective. If the sufficient or effective programmed state is attained, the automatic programming operation is terminated (step ST50) since the output AEND of the final address detecting circuit 24 is already fixed at "1" and a state in which the final address is detected is set.

When the sufficient programmed state is attained, the output signal of the register 29-1 (refer to FIG. 15) of the verify bit register 27 is set to "1" since the control signal VERIOK of the verify circuit 23 is set at "1". As a result, the control signal PVOK is set to "1" (step ST7).

When the control signal PVOK is set to "1", the steps of "Erase" and "Convergence" in the auto-sequence are skipped since the control signals EVOK, LCKOK are already fixed at "1".

Further, since the detection signal BEND indicating the final block is already fixed at "1", a read set-up process for discharging a boosted voltage generated from a charge pump circuit is effected and then the operation is terminated (steps ST16, ST17).

On the other hand, if data of the selected memory cell and program data do not coincide with each other, it is determined that the programmed state is insufficient and the operation of programming data (injecting electrons into the floating gate) is effected for the selected memory cell.

The data programming operation is repeatedly effected (steps ST46, ST48, ST49) until data of the selected memory cell becomes equal to the program data if the number of operations does not reach a preset number Limit.

If the number Cycle of program operations for the selected memory cell has reached the preset number Limit, the program operation is not effected again even when the result of verify indicates that the programmed state is insufficient.

After the signal ERROR indicating that the programmed state is insufficient is set to "1", the automatic programming operation is terminated (step ST47). If the control signal ERROR is set to "1", the control circuit 21 immediately terminates the operation after the read set-up process is effected (steps ST6, ST17).

(2) Next, the Automatic Erasing Operation is Explained.

When the command register 19 recognizes the erase command, it first determines a block of the memory cell array 11 to be subjected to the erase operation.

In the case of block erase mode, a block to be subjected to the erase operation and blocks which are not subjected to the erase operation are present at the same time, but in the case of chip erase mode, all of the blocks are selected blocks to be subjected to the erase operation.

When the command register 19 recognizes a command of automatic erase mode, it outputs a control signal to the multiplexer 13 so as to permit the internal address of the address counter 16 to be supplied to the row decoder 14 and column decoder 15.

Further, the control circuit 21 first sets the control signal PRGMODE to "1" and sets the control signals ERSMODE, CONVMODE to "0".

At this time, since the output signal PRGCMD of the command register 19 is set at "0" and outputs of the registers 29-1 to 29-3 are initialized to "0", the control signals PVOK, EVOK, LCKOK are kept at "0". In this case, the test signals TEST1 to TEST3 are all set at "0".

After this, the address counter 16, timer 25 and the like are reset. Further, since the control signal PVOK is set at "0", the pre-program operation is started (steps ST1 to ST4).

The pre-program operation is an operation for making equal the threshold values of all of the memory cells in each selected block before erasing.

The pre-program operation is effected according to the subroutine shown in FIG. 5.

First, an address Add of the address counter 16 is set to an initial value "0" and a numeric value (corresponding to the number of program operations) Cycle of the timer 25 is set to an initial value "0" (steps ST41, ST42). Further, in the voltage generating circuit 22, the internal power supply of the program verify P.V. is set up (step ST43).

After this, data of a memory cell or memory cells (n memory cells (n is a positive natural number) when the flash EEPROM is of xn type) selected by the address Add is read out (step ST44).

Data of a memory cell (which is hereinafter referred to as a selected memory cell) selected by the address Add is compared with the program data "0" (step ST45).

That is, the lower limit voltage (for example, 5.5 V) of the threshold voltage which can be verified as the programmed state is set as a boundary value, data of the selected memory cell is determined as "0" if the threshold value of the selected memory cell is higher than the boundary value, and data of the selected memory cell is determined as "1" if the threshold value of the selected memory cell is lower than the boundary value.

Then, if data of the selected memory cell does not coincide with the program data "0", it is determined that the programmed state is insufficient and the data programming operation is effected for the selected memory cell (electrons are injected into the floating gate).

The data programming operation is repeatedly effected until data of the selected memory cell becomes equal to the program data "0" if a preset number Limit is not reached (steps ST48, ST49).

When the number Cycle of programming operations for the selected memory cell has reached the preset number Limit, the programming operation is not effected again even if the result of verify indicates that the programmed state is insufficient.

After a signal ERROR indicating occurrence of an insufficient programmed state is set to "1", the pre-program operation is terminated (step ST47). Further, when the signal ERROR indicating occurrence of the insufficient programmed state is set to "1", the read se-up process for discharging the boosted voltage generated by the charge pump circuit is effected and then the automatic erasing operation is terminated (steps ST6, ST17).

If data of the selected memory cell coincides with the program data "0", it is determined that the programmed state of the selected memory cell is sufficient and the address Add is incremented by one, and the same operation is effected for a memory cell selected by a next address. At this time, the value of the timer 25 is reset to the initial value (steps ST42, ST51).

Thus, the program operation is sequentially effected for all of the memory cells 1 to N in the block (refer to FIG. 16).

If data of the selected memory cell coincides with the program data "0" and when the address Add is the final address (AEND=1) in the block, the pre-program operation is terminated.

At this time, since all of the memory cells are set in the sufficient programmed state, the output signal VERIOK (which is output at each time of verify) of the verify circuit 23 is naturally set at "1" (step ST50).

When the output signal VERIOK of the verify circuit 23 is set at "1", the register 29-1 (refer to FIG. 15) of the verify bit register latches data "1". When data "1" is latched in the register 29-1, the control signal PVOK is set to "1".

After this, if the signal ERROR indicating that the programmed state is sufficient or insufficient is set at "0" and the control signal PVOK is set at "1", the erase operation is effected (steps ST4, ST8, ST9). The erase operation is an operation for simultaneously erasing data of all of the memory cells for each selected block.

At this time, the control circuit 21 sets the control signal ERSMODE to "1" and sets the control signals PRGMODE, CONVMODE to "0".

The register 29-1 (refer to FIG. 15) of the verify bit register continues to latch data "1" even after the control signal PRGMODE is set to "0". Therefore, the control signal PVOK is kept at "1". At this time, the test signals TEST1 to TEST3 are all set at "0".

Figure 7:
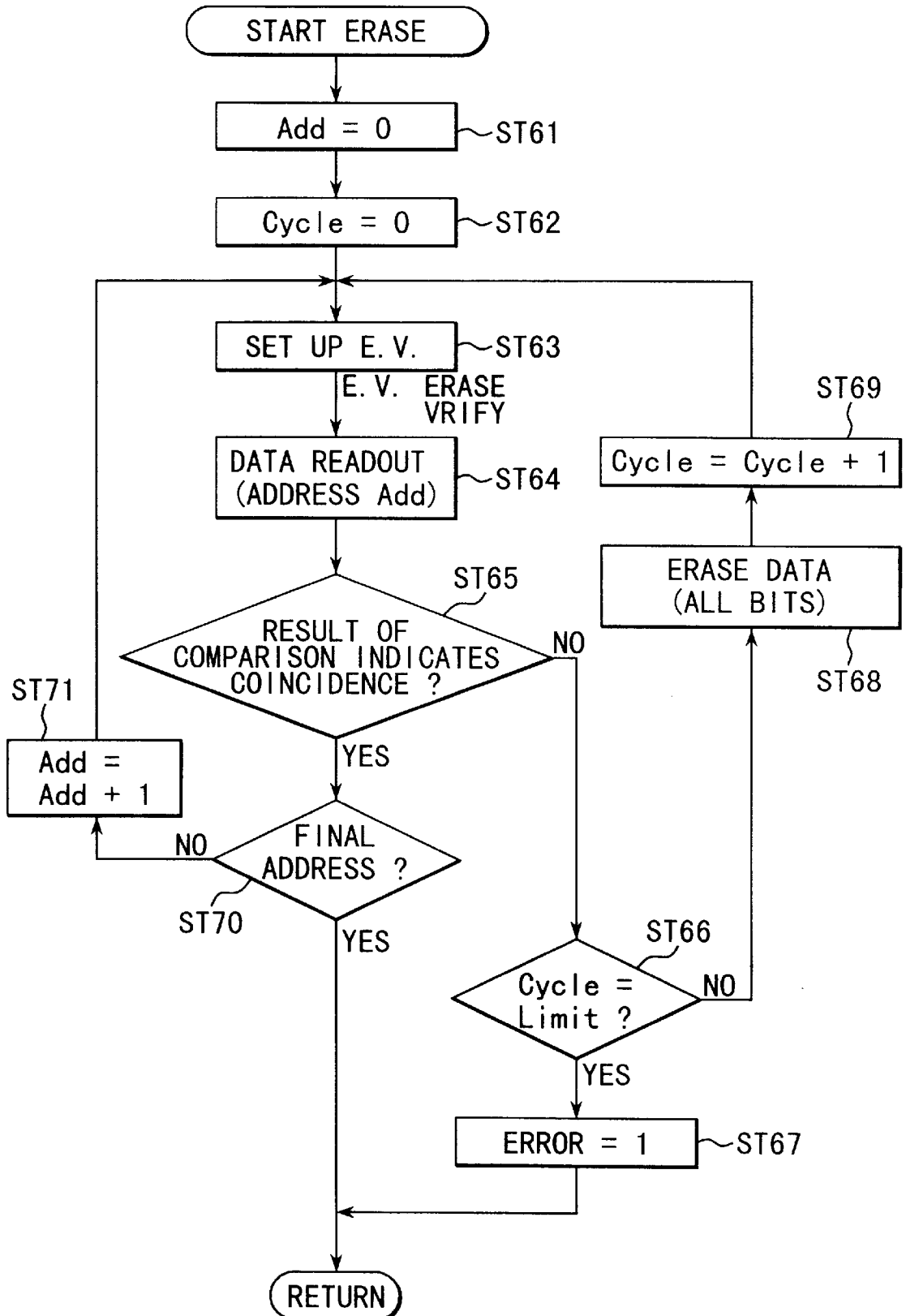
FIG. 7 is a diagram showing the subroutine of the erase operation.

The erase operation is effected according to the procedure shown by the subroutine of FIG. 7.

First, an address Add of the address counter 16 is set to the initial value "0" and a numeric value (corresponding to the number of erasing operations) Cycle of the timer 25 is set to an initial value "0" (steps ST61, ST62). Further, in the voltage generating circuit 22, the internal power supply of the erase verify E.V. is set up (step ST63).

After this, data of a memory cell or memory cells (n memory cells (n is a positive natural number) when the flash EEPROM is of xn type) selected by the address Add is read out (step ST64).

Data of a memory cell (which is hereinafter referred to as a selected memory cell) selected by the address Add is compared with an expected value "1" (step ST65).

That is, the upper limit voltage (for example, 3.0 V) of the threshold voltage which can be verified as the erased state is set as a boundary value, data of the selected memory cell is determined as "0" if the threshold value of the selected memory cell is higher than the boundary value, and data of the selected memory cell is determined as "1" if the threshold value of the selected memory cell is lower than the boundary value.

Then, if data of the selected memory cell does not coincide with the expected value "1", it is determined that the erased state is insufficient and the data erasing operation (the operation for drawing electrons out of the floating gates) is effected for all of the memory cells of the selected block.

In this case, the data erasing operation (flash erasing) is effected for all of the memory cells in the selected block and this erasing operation is a peculiar operation of the flash EEPROM. Therefore, the erasing operation is effected not only for the selected memory cell but also for the memory cells in which data is already erased.

The erasing operation is repeatedly effected (steps ST66, ST68, ST69) until data of the selected memory cell becomes equal to the expected value "1" if a preset number Limit is not reached.

When the number Cycle of erasing operations for the selected memory cell has reached the preset number Limit, the erasing operation is not effected again even if the result of verify indicates that the erased state is insufficient.

Then, a signal ERROR indicating occurrence of an insufficient or ineffective erased state is set to "1" (step ST67). When the signal ERROR indicating occurrence of an ineffective erased state is set to "1", the automatic erasing operation is terminated (steps ST10, ST17) after the read set-up process for discharging the boosted voltage generated from the charge pump circuit is effected.

On the other hand, if data of the selected memory cell coincides with the expected value "1", it is determined that the erased state of the selected memory cell is sufficient, and then, the address Add is incremented by one and the same operation is effected for a memory cell selected by a next address. At this time, the value of the timer 25 is not reset to the initial value. This is because the erase operation is effected for all of the memory cells (step ST71).

Thus, the data erasing operation is sequentially effected for all of the memory cells 1 to N in the block (refer to FIG. 16).

If data of the selected memory cell coincides with the expected value "1" and when the address Add is the final address (AEND=1) in the block, the erase operation is terminated.

At this time, since all of the memory cells are set in the sufficient erased state, the output signal VERIOK (which is output at each time of verify) of the verify circuit 23 is naturally set at "1" (step ST70).

When the output signal VERIOK of the verify circuit 23 is set at "1", data "1" is latched in the register 29-2 of the verify bit register. When data "1" is latched in the register 29-2, the control signal EVOK is set to "1".

After this, if the signal ERROR indicating that the insufficient erased state occurs or not is set at "0" and the control signals PVOK, EVOK are set at "1", the convergence operation is effected (steps ST8, ST12, ST13).

The convergence operation is an operation for detecting memory cells set in the excessively erased state in each selected block and restoring the threshold values of the memory cells in the excessively erased state to normal values.

The control circuit 21 sets the control signal CONVMODE to "1" and sets the control signals PRGMODE, ERSMODE to "0".

Further, the register 29-2 (refer to FIG. 15) of the verify bit register continues to latch data "1" even after the control signal ERSMODE is set to "0". Therefore, the control signal EVOK is kept at "1".

The register 29-1 (refer to FIG. 15) of the verify bit register also continues to latch data "1". At this time, the test signals TEST1 to TEST3 are all set at "0".

Figure 9:
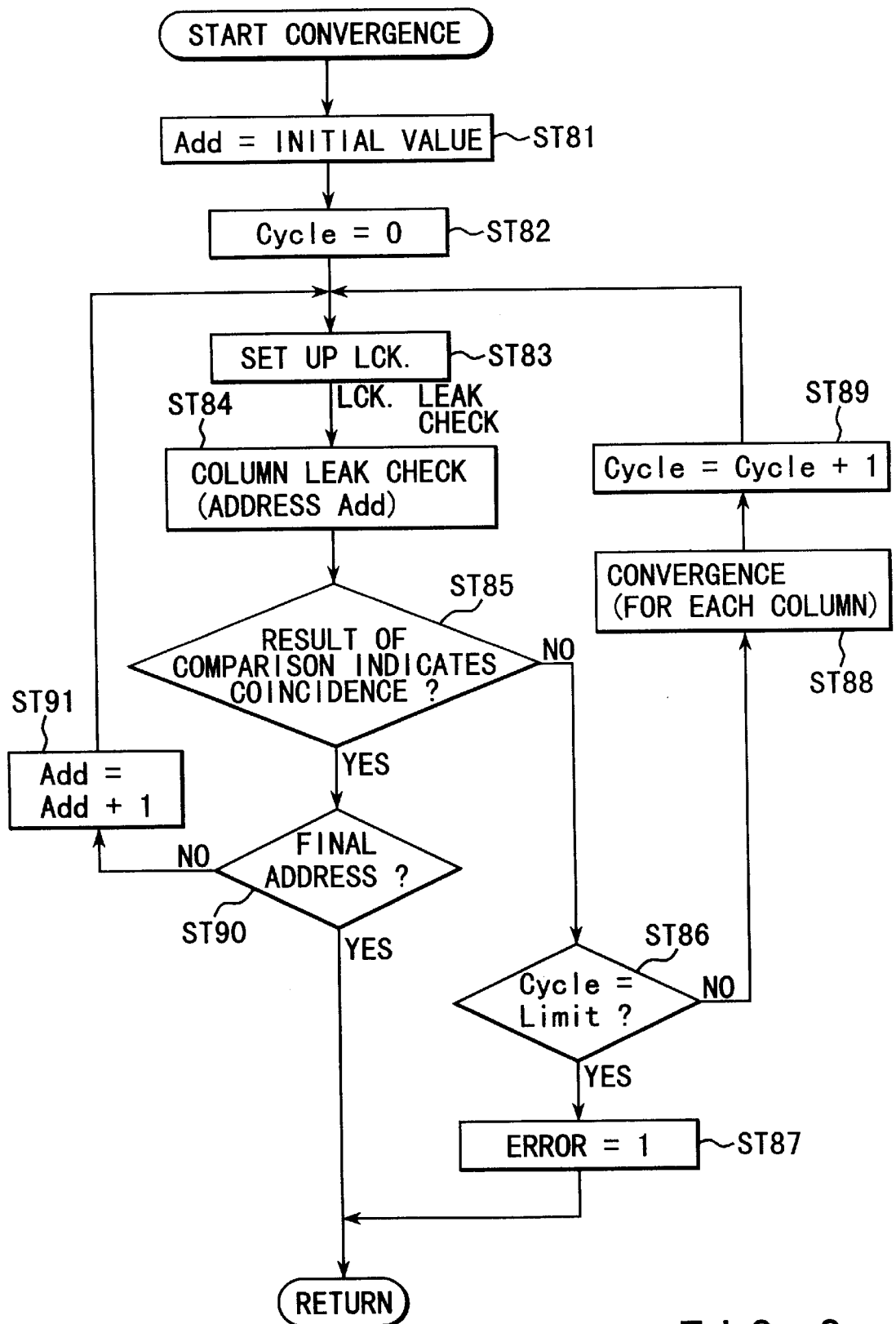
FIG. 9 is a diagram showing the subroutine of the convergence operation.
Figure 11:
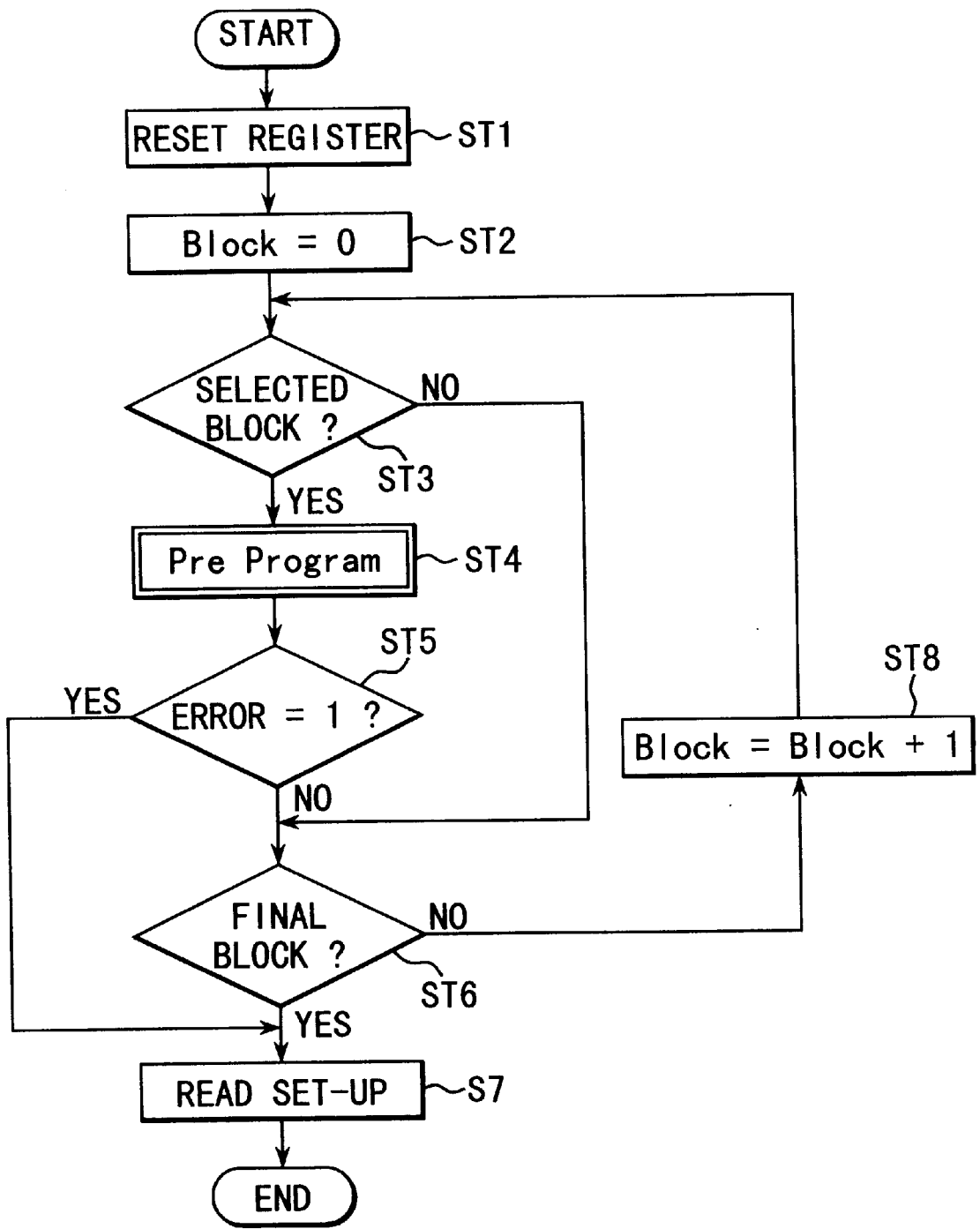
FIG. 11 is a diagram showing an auto-sequence of the conventional automatic program test operation.
Figure 12:
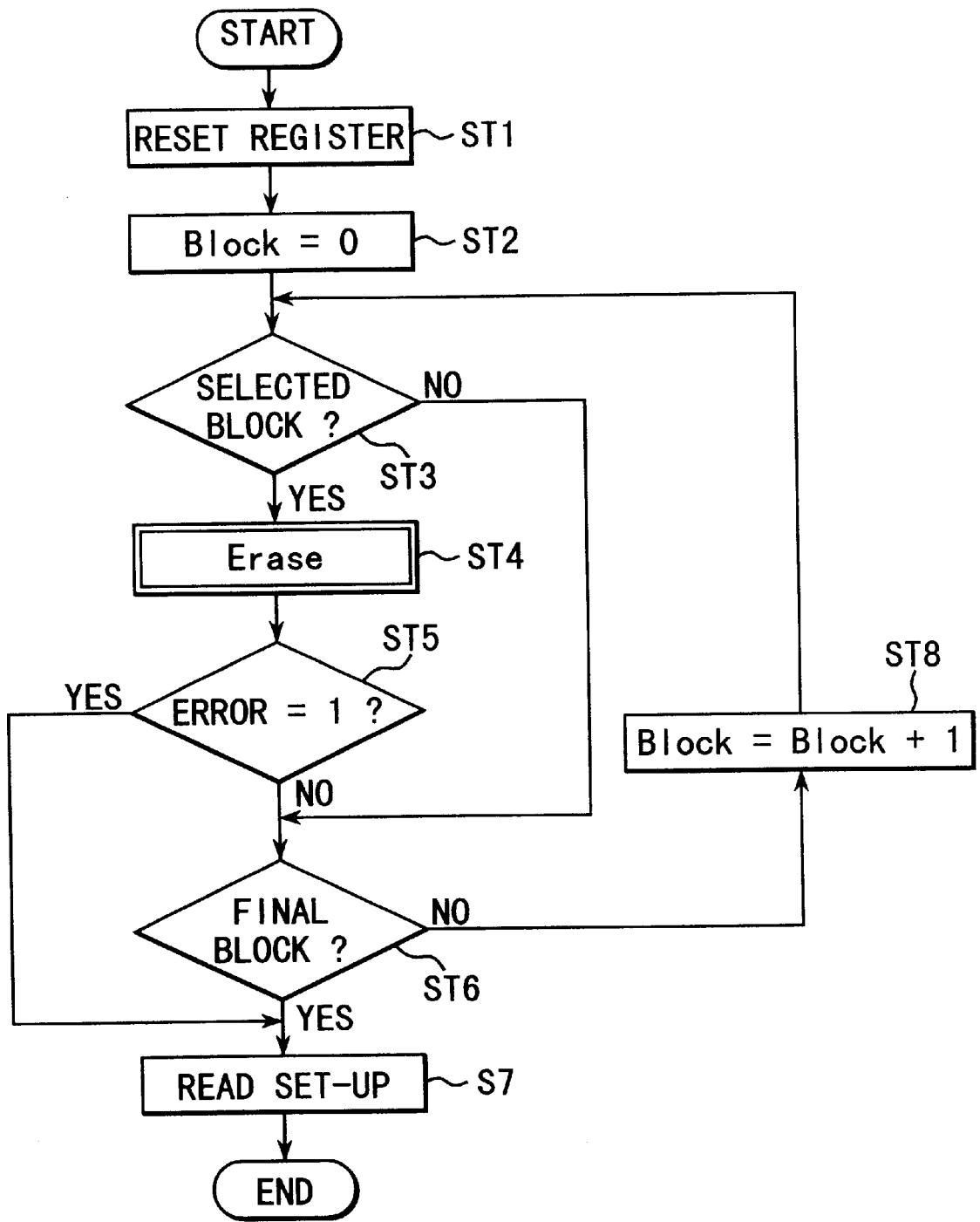
FIG. 12 is a diagram showing an auto-sequence of the conventional automatic erase test operation
Figure 13:
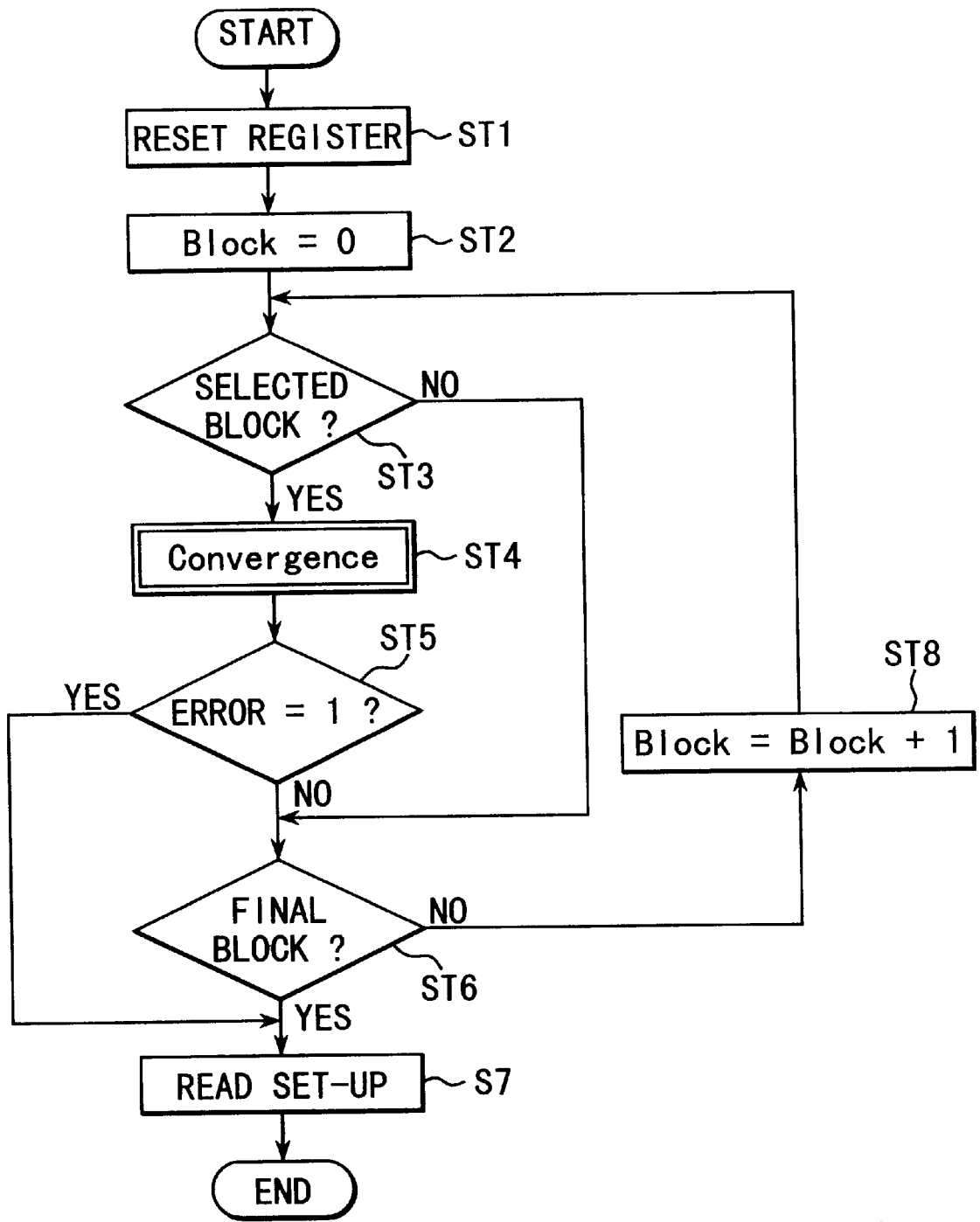
FIG. 13 is a diagram showing an auto-sequence of the conventional automatic convergence test operation.

The convergence operation is effected according to the procedure shown by the subroutine of FIG. 9.

First, the address (which is used for selecting only a column and the none of the rows are selected) Add of the address counter 16 is set to the initial value and the numeric value (corresponding to the number of convergence operations) Cycle of the timer 25 is set to the initial value "0" (steps ST81, ST82). Further, the internal power supply for the leak check LCK. is set up in the voltage generating circuit 22 (step ST83).

After this, the column leak check process (leak check of memory cells for each column) is effected (step ST84).

The column leak check process is to set all of the rows (word lines) into the non-selected state, set one of the columns into the selected state, check a leak current flowing in the selected column and verify whether a memory cell set in the excessively erased state is present or not.

That is, data of the selected column is determined as "0" if the total sum of the leak currents flowing in all of the memory cells on the selected column is smaller than the reference value, and data of the selected column is determined as "1" if the total sum of the leak currents flowing in all of the memory cells on the selected column is larger than the reference value.

The leak current occurs in a memory cell whose threshold value is lower than 0.5 V and which is set in the excessively erased state. That is, the memory cell set in the excessively erased state permits current flow even in the non-selected state (the word line potential is 0 V).

Then, data of the selected column is compared with the expected value "0" (step ST85).

If data of the selected column does not coincide with the expected value "0", it is determined that the convergence state is insufficient and the convergence operation (which is the operation for eliminating the excessively erased state) is effected for all of the memory cells on the selected column.

The convergence operation is repeatedly effected (steps ST86, ST88, ST89) until data of the selected column becomes equal to the expected value "0" if a preset number Limit is not reached.

When the number Cycle of convergence operations for the selected column has reached the preset number Limit, the convergence operation is not effected again even if the result of verify indicates that the convergence state is insufficient.

The signal ERROR indicating that the convergence state is insufficient is set to "1" (step ST87). When the signal ERROR indicating that the convergence state is insufficient is set at "1", the read set-up process for discharging a boosted voltage generated from the charge pump circuit is effected and then the convergence operation is terminated (steps ST14, ST17).

On the other hand, if data of the selected column coincides with the expected value "0", it is determined that all of the memory cells on the selected column are set into the sufficient convergence state and the address Add is incremented by one, and the same operation is effected for memory cells on a next column (step ST91).

Thus, the convergence operation is sequentially effected for all of the memory cells 1 to N in the block for each column (refer to FIG. 17).

If data of the selected column coincides with the expected value "0" and when the address Add is an address (AEND=1) for selecting the final column in the block, the convergence operation is terminated.

At this time, since the convergence states of all of the columns in the block are sufficient, the output signal VERIOK (which is output at each time of verify) of the verify circuit 23 is naturally set at "1" (step ST90).

When the output signal VERIOK of the verify circuit 23 is set at "1", data "1" is latched in the register 29-3 of the verify bit register. When data "1" is latched in the register 29-3, the control signal LCKVOK is set to "1".

After this, if the signal ERROR indicating that the insufficient convergence state occurs or not is set at "0" and all of the control signals PVOK, EVOK, LCKOK are set at "1", the data erasing operation for the memory cells in the block which has been subjected to the above three operations (pre-program, erase and convergence operations) is completed and the same operation is effected for a next block (steps ST16, ST18, ST19).

Figure 1:
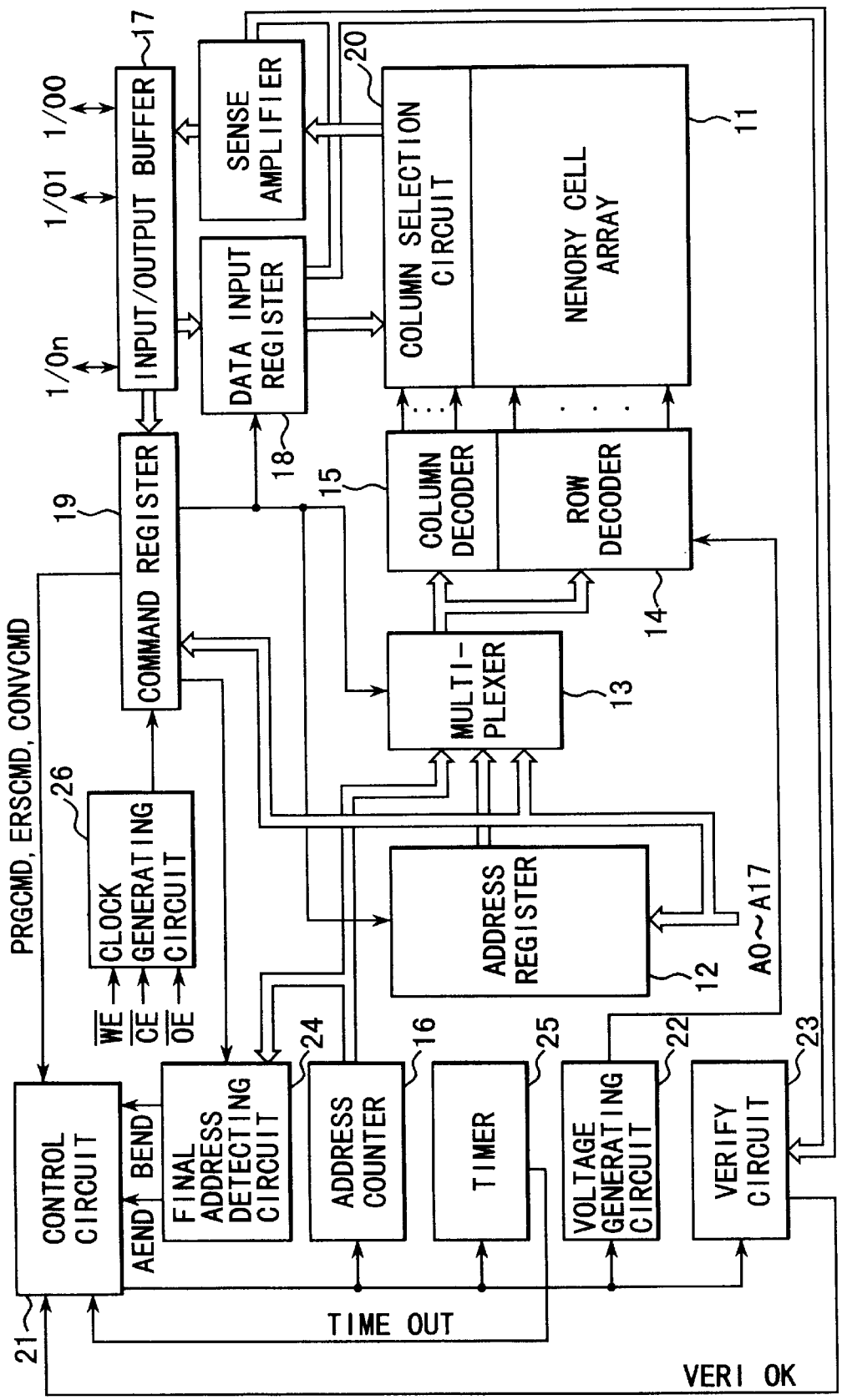
FIG. 1 is a block diagram showing a conventional nonvolatile semiconductor memory device.
Figure 2:
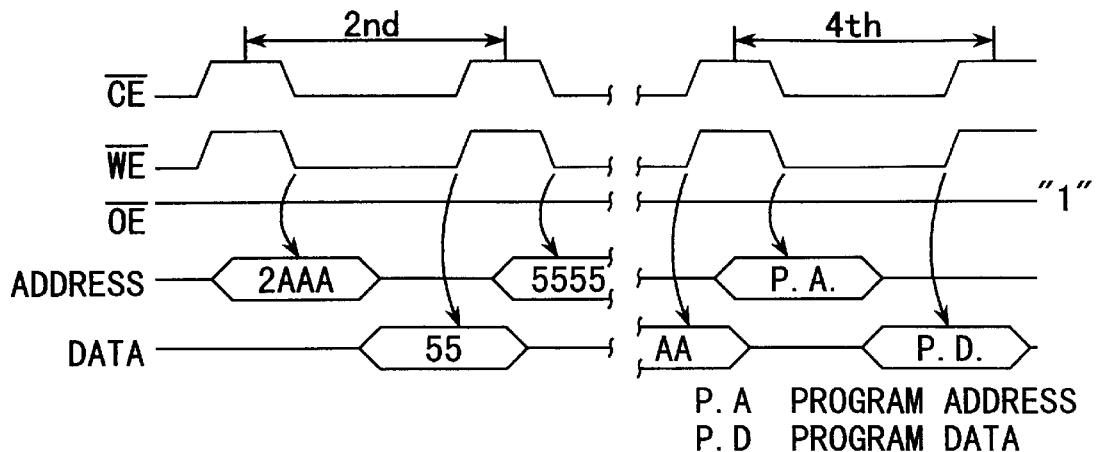
FIG. 2 is a diagram showing the state of an automatic program command and data input.
Figure 3:
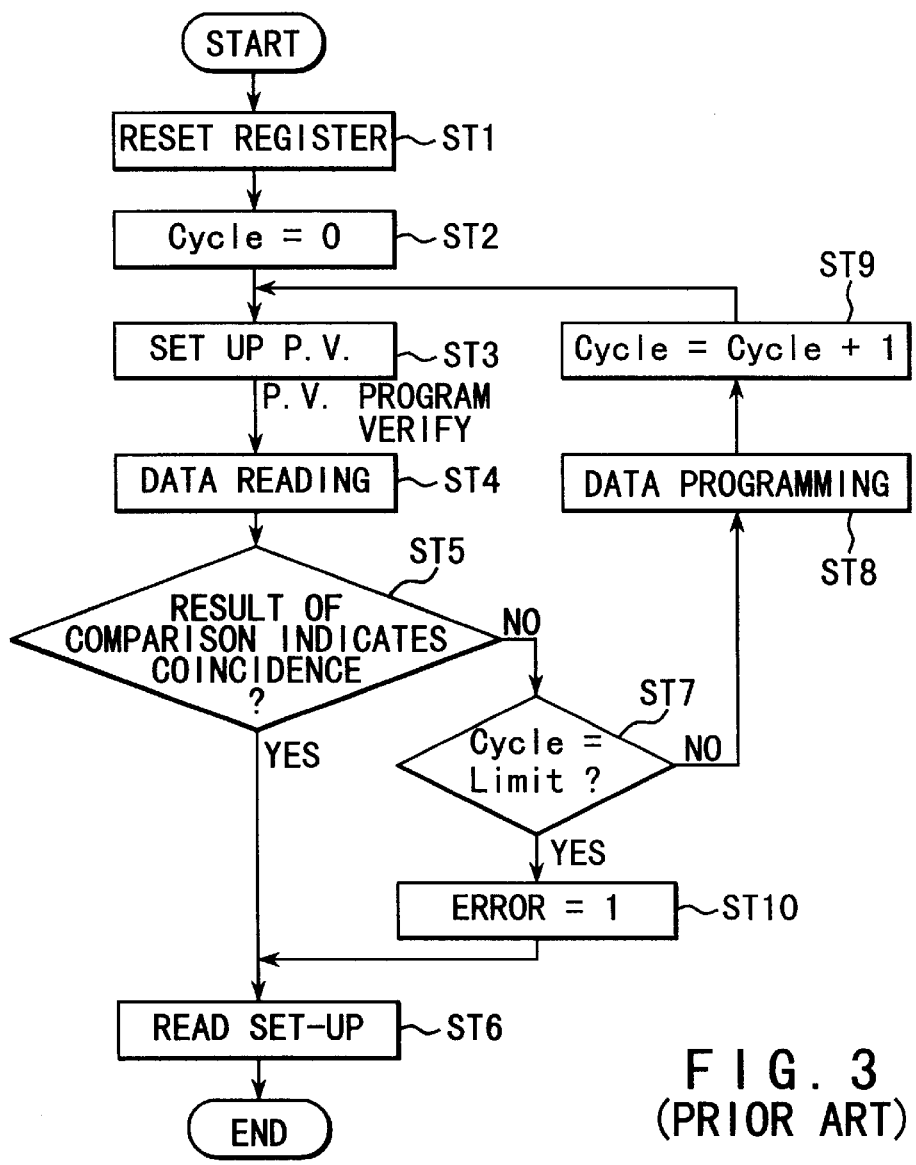
FIG. 3 is a diagram showing an auto-sequence of the conventional automatic programming operation.
Figure 4:
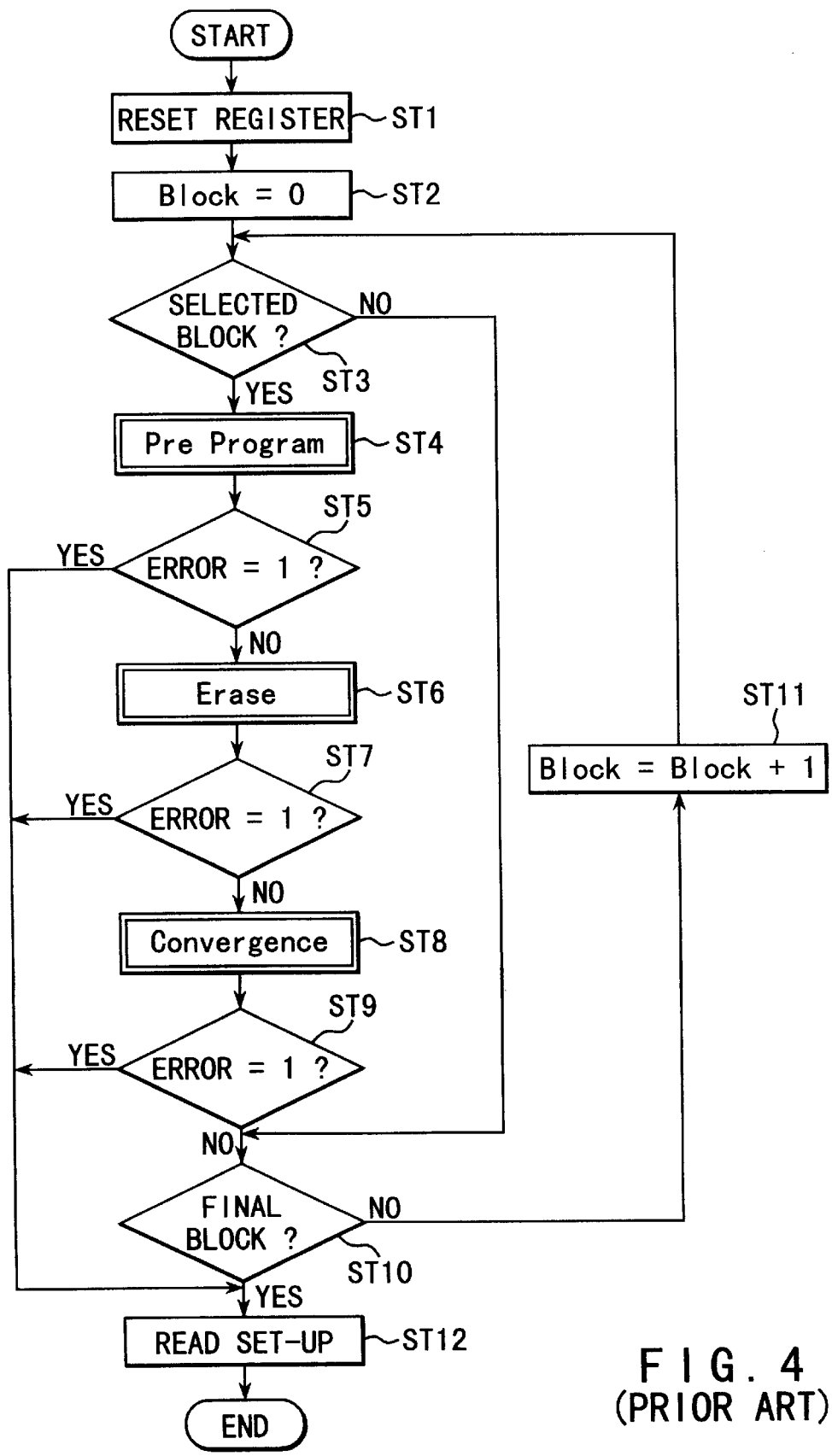
FIG. 4 is a diagram showing an auto-sequence of the conventional automatic erasing operation.

At this time, data items in the registers 29-1 to 29-3 (refer to FIG. 2) of the verify bit register are reset to "0" by the reset signal RESET. Therefore, the control signals PVOK, EVOK, LCKOK are set to "0" (steps ST18, ST19).

When the erasing operation for the block is completed and if the block is the final block (BEND=1), the read set-up process is effected and then the automatic erasing operation is terminated.

(3) Next, the Test Operation is Explained.

For example, as shown in Table 4, the test operation includes a test program operation for conducting a program test for all of the memory cells of the memory cell array 11, a test erase operation for conducting an erase test for all of the memory cells, a test convergence operation for conducting a convergence test for all of the memory cells, and a combination of the above operations.

When the above test operations are effected, the auto-sequence shown in FIG. 18 is applied. However, in order to effect the test operations, the control signals PVOK, EVOK, LCKOK are independently set to "1" by the control signals TEST1 to TEST3 of the test circuit 28.

For example, when only the program test is conducted, only the program test can be conducted without effecting the erase operation and the convergence operation in the auto-sequence of FIG. 18 if the control signals TEST2, TEST3 are set to "1" so as to fix the control signals EVOK, LCKOK at "1".

Likewise, when only the erase test is conducted, the control signals TEST1, TEST3 are set to "1" so as to fix the control signals PVOK, LCKOK at "1". When only the convergence test is conducted, the control signals TEST1, TEST2 are set to "1" so as to fix the control signals PVOK, EVOK at "1".

Further, when the test operation is effected, the command of the automatic erasing operation is supplied to the command register 19.

That is, the sequence of the pre-program operation in the automatic erasing operation is used for the test program operation, the sequence of the erase operation in the automatic erasing operation is used for the test erase operation, and the sequence of the convergence operation in the automatic erasing operation is used for the test convergence operation.

Next, the test program operation which is one of the test sequences is explained.

First, the control signals TEST2, TEST3 of the test circuit 28 are set to "1" so as to fix the control signals EVOK, LCKOK at "1". After this, the block erasing command is supplied to the command register 19 and a block to be subjected to the test program operation is selected. When the test operation is effected for all of the blocks, the chip erase command may be supplied to the command register 19.

Then, the address Add of the address counter 16 is set to the initial value "0" and the numeric value Cycle of the timer 25 is set to the initial value (steps ST41, ST42). Further, in the voltage generating circuit 22, the internal power supply of the program verify P.V. is set up (step ST43).

After this, data of a memory cell or memory cells (n memory cells (n is a positive natural number) when the flash EEPROM is of xn type) selected by the address Add is read out (step ST44).

Data of a memory cell (which is hereinafter referred to as a selected memory cell) selected by the address Add is compared with the program data "0" (step ST45).

Then, if data of the selected memory cell does not coincide with the program data "0", it is determined that the programmed state is insufficient and the data programming operation is effected for the selected memory cell (electrons are injected into the floating gate).

The data programming operation is repeatedly effected until data of the selected memory cell becomes equal to the program data "0" if a preset number Limit is not reached (steps ST48, ST49).

When the number Cycle of programming operations for the selected memory cell has reached the preset number Limit, the programming operation is not effected again even if the result of verify indicates that the programmed state is insufficient.

Then, a signal ERROR indicating occurrence of an insufficient programmed state is set to "1" and the test program operation is terminated (step ST47).

If data of the selected memory cell coincides with the program data "0", it is determined that the selected memory cell is set in the sufficient programmed state and the address Add is incremented by one, and the same operation is effected for a memory cell selected by a next address. At this time, the value of the timer 25 is reset to the initial value (steps ST42, ST51).

Thus, the program operation is sequentially effected for all of the memory cells 1 to N in the block (refer to FIG. 16).

If data of the selected memory cell coincides with the program data "0" and when the address Add is the final address (AEND=1) in the block, the test program operation is terminated.

At this time, since all of the memory cells in the block are set in the sufficient programmed state, the output signal VERIOK (which is output at each time of verify) of the verify circuit 23 is naturally set at "1" (step ST50).

When the output signal VERIOK of the verify circuit 23 is set at "1", data "1" is latched in the register 29-1 of the verify bit register. When data "1" is latched in the register 29-1, the control signal PVOK is set to "1".

After this, if the signal ERROR indicating that the insufficient programmed state occurs or not is set at "0" and the control signal PVOK is set at "1", it is determined that the program test operation for the selected block is correctly effected since the control signals EVOK, LCKOK are already set at "1", and then the same operation is effected for a next block (step ST18, ST19).

At this time, since the registers 29-1 to 29-3 of the verify bit register are reset by the reset signal RESET to latch data "0", the control signal PVOK is set to "0". However, the control signals EVOK, LCKOK are kept at "1" since the control signals TEST2, TEST3 are set at "1".

The test program operation is effected for selected blocks among all of the blocks, and when the test for the final block is terminated, that is, when the output signal BEND of the final address detecting circuit 24 is set to "1", the test program operation is terminated (steps ST16, ST17).

As described above, according to the nonvolatile semiconductor memory device of this invention, the following effects can be attained.

The program mode and erase mode (including the test mode) in which data is automatically programmed or erased based on the verify operation are provided and the above operation modes are effected by use of one auto-sequence so as to alleviate the load of the control circuit. More specifically, new bits PVOK, EVOK, LCKOK are provided in addition to normal commands for specifying the modes, PVOK is used to indicate that the pre-program operation is terminated when the operation is correctly effected, EVOK is used to indicate that the erase operation is terminated when the operation is correctly effected, and LCKOK is used to indicate that the convergence operation is terminated when the operation is correctly effected. Further, the construction is made to independently fix the bits PVOK, EVOK, LCKOK to a preset value "1" by use of the test signals TEST1 to TEST3.

Further, the multiplexer and data input register are controlled so as to permit a desired address and data to be input in each operation mode. In addition, the construction is made to forcedly set the bit AEND indicating the final address in the block and the bit BEND indicating the final block to a preset value "1" when a preset command is effectively set or according to the test signals TEST1 to TEST3.

That is, the program mode and erase mode (including the test mode) in which data is automatically programmed or erased based on the verify operation can be attained by use of one auto-sequence by controlling the values of the bits PVOK, EVOK, LCKOK, AEND, BEND and the various circuits.

Further, since all of the test modes can be attained by use of commands of block erasing, chip erasing, the test command can be omitted, the testing time can be shortened by reducing the number of commands used and the circuit area can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A nonvolatile semiconductor memory device comprising:

a verify bit register having a first bit for determining whether a program operation is effected or not, a second bit for determining whether an erase operation is effected or not and a third bit for determining whether a convergence operation is effected or not, for determining values of the first to third bits according to operation modes; and a control circuit for effecting at least one of the program, erase and convergence operations according to the values of the first to third bits, wherein said control circuit determines whether the program operation is effected or not based on the value of the first bit when the program or erase operation is effected for a memory cell, determines whether the erase operation is effected or not based on the value of the second bit when it is determined that the program operation is not effected, determines whether the convergence operation is effected or not based on the value of the third bit when it is determined that the erase operation is not effected, and terminates the program or erase operation when it is determined that the convergence operation is not effected.

2. A nonvolatile semiconductor memory device according to claim 1, further comprising a test circuit for outputting a first test bit for forcedly setting the first bit to a value which permits the program operation, a second test bit for forcedly setting the second bit to a value which permits the erase operation and a third test bit for forcedly setting the third bit to a value which permits the convergence operation to said verify bit register.

3. A nonvolatile semiconductor memory device according to claim 2, wherein at least one of the program, erase and convergence operations is tested according to the values of the first to third test bits when said command register recognizes the command of the automatic erase mode.

4. A nonvolatile semiconductor memory device according to claim 1, further comprising a command register for recognizing the operation mode.

5. A nonvolatile semiconductor memory device according to claim 4, wherein said control circuit outputs a fourth bit indicating a state in which the program operation is effected, a fifth bit indicating a state in which the erase operation is effected and a sixth bit indicating a state in which the convergence operation is effected to said verify bit register.

6. A nonvolatile semiconductor memory device according to claim 5, which further comprises an address counter for generating an internal address, and a timer for detecting the number of verify operations and in which said control circuit resets the value of said address counter and the value of said timer when said command register recognizes the operation mode.

7. A nonvolatile semiconductor memory device according to claim 6, further comprising a verify circuit for effecting the verify operation, said verify circuit outputting a seventh bit indicating the result of the verify operation to said verify bit register.

8. A nonvolatile semiconductor memory device according to claim 7, further comprising a final address detecting circuit for outputting an eighth bit indicating that the internal address is a final address.

9. A nonvolatile semiconductor memory device according to claim 8, further comprising a row and column decoder, an address register for latching an external address, and a multiplexer for selecting one of the internal address, external address and the address latched in said address register and supplying the selected address to said row and column decoder.

10. A nonvolatile semiconductor memory device according to claim 9, wherein the second and third bits are set to values which inhibit the erase and convergence operations and the first bit is set to a value which permits or inhibits the program operation according to the value of the seventh bit when said command register recognizes the command of the automatic program mode.

11. A nonvolatile semiconductor memory device according to claim 9, wherein said multiplexer supplies the address latched in said address register to said row and column decoder when said command register recognizes the command of the automatic program mode.

12. A nonvolatile semiconductor memory device according to claim 9, wherein the eighth bit is forcedly set to a value indicating a state in which the final address is detected when said command register recognizes the command of the automatic program mode.

13. A nonvolatile semiconductor memory device according to claim 9, wherein the first, second and third bits are set to preset values according to the values of the fourth, fifth, sixth and seventh bits when said command register recognizes the command of the automatic erase mode.

14. A nonvolatile semiconductor memory device according to claim 9, wherein said multiplexer supplies the internal address of said address counter to said row and column decoder when said command register recognizes the command of the automatic erase mode.

15. A nonvolatile semiconductor memory device according to claim 9, wherein said final address detecting circuit outputs a ninth bit indicating that a block which is subjected to the automatic erasing operation is a final block or not in a case wherein a memory cell array includes a plurality of blocks and the automatic erasing operation is effected for each of the blocks.

16. A nonvolatile semiconductor memory device according to claim 9, wherein said verify bit register is supplied with a reset signal and the values of the first to third bits are reset to preset values according to the reset signal.

17. A nonvolatile semiconductor memory device according to claim 9, wherein said control circuit does not effect the program, erase or convergence operation again when the number of verify operations has reached a preset number set in said timer.

* * * * *